United States Patent
Shimozono

(10) Patent No.: US 8,994,479 B2
(45) Date of Patent: Mar. 31, 2015

(54) SURFACE ACOUSTIC WAVE DEVICE

(75) Inventor: Masahisa Shimozono, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 372 days.

(21) Appl. No.: 13/390,905

(22) PCT Filed: Aug. 25, 2010

(86) PCT No.: PCT/JP2010/064422
§ 371 (c)(1),
(2), (4) Date: Feb. 16, 2012

(87) PCT Pub. No.: WO2011/024876
PCT Pub. Date: Mar. 3, 2011

(65) Prior Publication Data
US 2012/0146746 A1    Jun. 14, 2012

(30) Foreign Application Priority Data
Aug. 25, 2009 (JP) ................ 2009-194412

(51) Int. Cl.
*H03H 9/145* (2006.01)
*H03H 9/64* (2006.01)
*H03H 9/00* (2006.01)

(52) U.S. Cl.
CPC ......... *H03H 9/14582* (2013.01); *H03H 9/0038* (2013.01); *H03H 9/0061* (2013.01)
USPC ...................... 333/195; 310/313 B

(58) Field of Classification Search
CPC ....... H03H 9/64; H03H 9/725; H03H 9/0038; H03H 9/0061; H03H 9/14582
USPC .......... 333/133, 193, 194, 195, 196; 310/313 B, 313 D
See application file for complete search history.

(56) References Cited

U.S. PATENT DOCUMENTS

2007/0024397 A1 *    2/2007   Otsuka et al. ................. 333/195

FOREIGN PATENT DOCUMENTS

| JP | 2004-023255 | 1/2004 |
| JP | 2006-128926 | 5/2006 |
| JP | 2006-333171 | 12/2006 |
| JP | 2008035092 A | 2/2008 |
| WO | WO 2009001651 A1 * | 12/2008 |

OTHER PUBLICATIONS

Shogo Inoue, Jun Tsutsumi, Takashi Matsuda, Masanori Ueda, Osamu Ikata, and Yoshio Satho, "Ultra-Steep Cut-Off Double Mode SAW Filter and Its Application to a PCS Duplexer", IEEE Transactions on Unltrasonic, Ferroelectrics and Frequency Control, vol. 54, No. 9, Sep. 2007.*

* cited by examiner

*Primary Examiner* — Benny Lee
*Assistant Examiner* — Jorge Salazar, Jr.
(74) *Attorney, Agent, or Firm* — Procopio, Cory, Hargreaves & Savitch LLP

(57) ABSTRACT

A surface acoustic wave SAW (SAW) device has a substrate and a filter provided at the substrate. The filter has a plurality of interdigital transducers (IDT) electrodes arranged along a propagation direction of a SAW. Each of the plurality of IDT electrodes has an electrode finger group including a plurality of electrode fingers which extent in a direction orthogonal to the propagation direction and are arranged along the propagation direction. At least one of the plurality of IDT electrodes has a wide pitch section including an adjacent first and second electrode finger among the plurality of electrode fingers. The interval between the first electrode finger and the second electrode finger is larger than the average value of the intervals between the remaining electrode fingers of the plurality of electrode fingers.

15 Claims, 29 Drawing Sheets

FIG. 8

| | | Tx | | | | Rx | | | | Tx-Rx Gap | |
|---|---|---|---|---|---|---|---|---|---|---|---|
| | | L | U | W | W/C | L | U | W | W/C | Lr-Ut | Gap/C_TxRx |
| UMTS | BAND1 | 1920 | 1980 | 60 | 3.08% | 2110 | 2170 | 60 | 2.80% | 130 | 6.36% |
| | BAND2 | 1850 | 1910 | 60 | 3.19% | 1930 | 1990 | 60 | 3.06% | 20 | 1.04% |
| | BAND3 | 1710 | 1785 | 75 | 4.29% | 1805 | 1880 | 75 | 4.07% | 20 | 1.11% |
| | BAND4 | 1710 | 1755 | 45 | 2.60% | 2110 | 2155 | 45 | 2.11% | 355 | 18.37% |
| | BAND5 | 824 | 849 | 25 | 2.99% | 869 | 894 | 25 | 2.84% | 20 | 2.33% |
| | BAND6 | 830 | 840 | 10 | 1.20% | 875 | 885 | 10 | 1.14% | 35 | 4.08% |
| | BAND7 | 2500 | 2570 | 70 | 2.76% | 2620 | 2690 | 70 | 2.64% | 50 | 1.93% |
| | BAND8 | 880 | 915 | 35 | 3.90% | 925 | 960 | 35 | 3.71% | 10 | 1.09% |
| | BAND9 | 1750 | 1785 | 35 | 1.98% | 1845 | 1880 | 35 | 1.88% | 60 | 3.31% |
| Nrml | BAND1 | 791 | 816 | 25 | 2.80% | 869 | 894 | 25 | 2.80% | 54 | 6.36% |
| | BAND2 | 832 | 859 | 27 | 3.06% | 868 | 895 | 27 | 3.06% | 9 | 1.04% |
| | BAND3 | 818 | 854 | 36 | 4.07% | 864 | 899 | 36 | 4.07% | 10 | 1.11% |
| | BAND4 | 707 | 725 | 19 | 2.11% | 872 | 891 | 19 | 2.11% | 147 | 18.37% |
| | BAND5 | 824 | 849 | 25 | 2.84% | 869 | 894 | 25 | 2.84% | 20 | 2.33% |
| | BAND6 | 831 | 841 | 10 | 1.14% | 876 | 887 | 10 | 1.14% | 35 | 4.08% |
| | BAND7 | 830 | 853 | 23 | 2.64% | 870 | 893 | 23 | 2.64% | 17 | 1.93% |
| | BAND8 | 823 | 856 | 33 | 3.71% | 865 | 898 | 33 | 3.71% | 9 | 1.09% |
| | BAND9 | 828 | 845 | 17 | 1.88% | 873 | 890 | 17 | 1.88% | 28 | 3.31% |

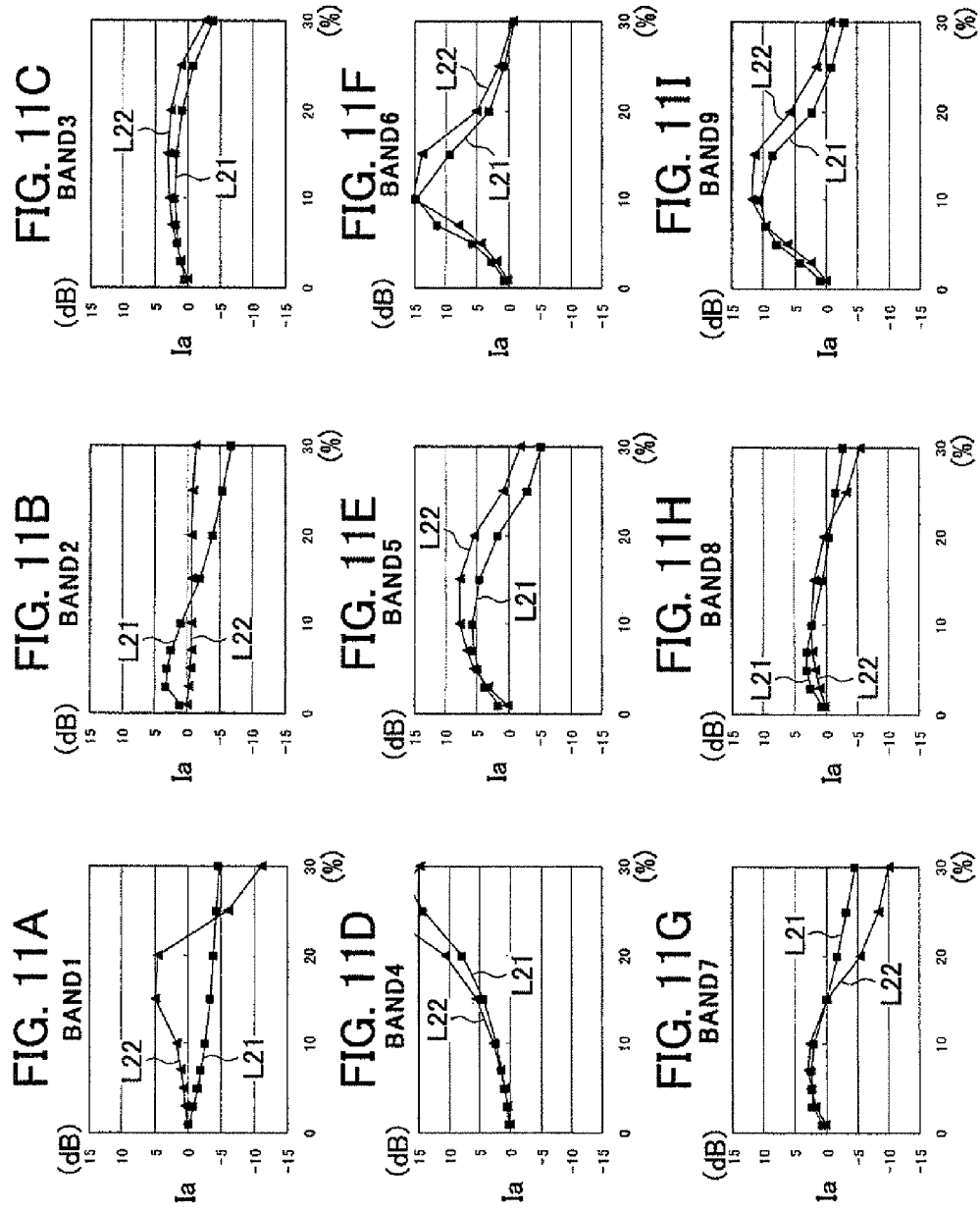

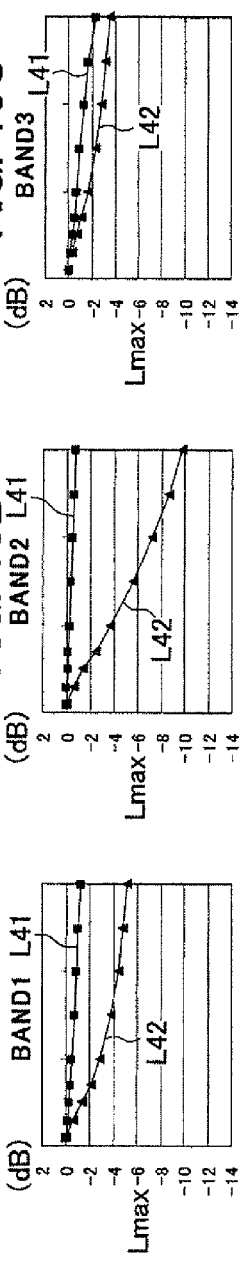
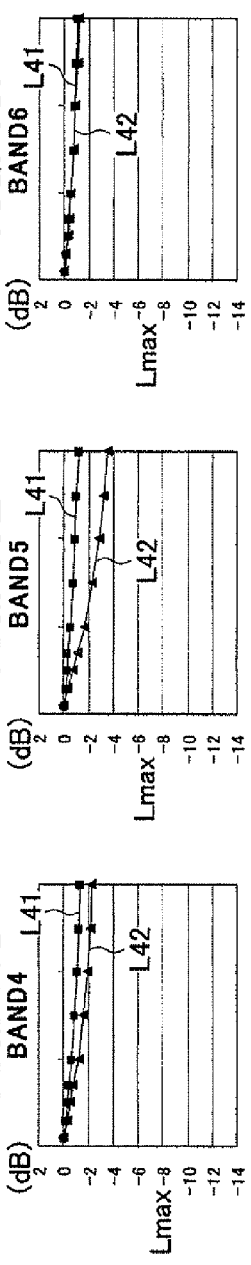
FIG. 13A BAND1
FIG. 13B BAND2
FIG. 13C BAND3
FIG. 13D BAND4
FIG. 13E BAND5
FIG. 13F BAND6
FIG. 13G BAND7
FIG. 13H BAND8
FIG. 13I BAND9

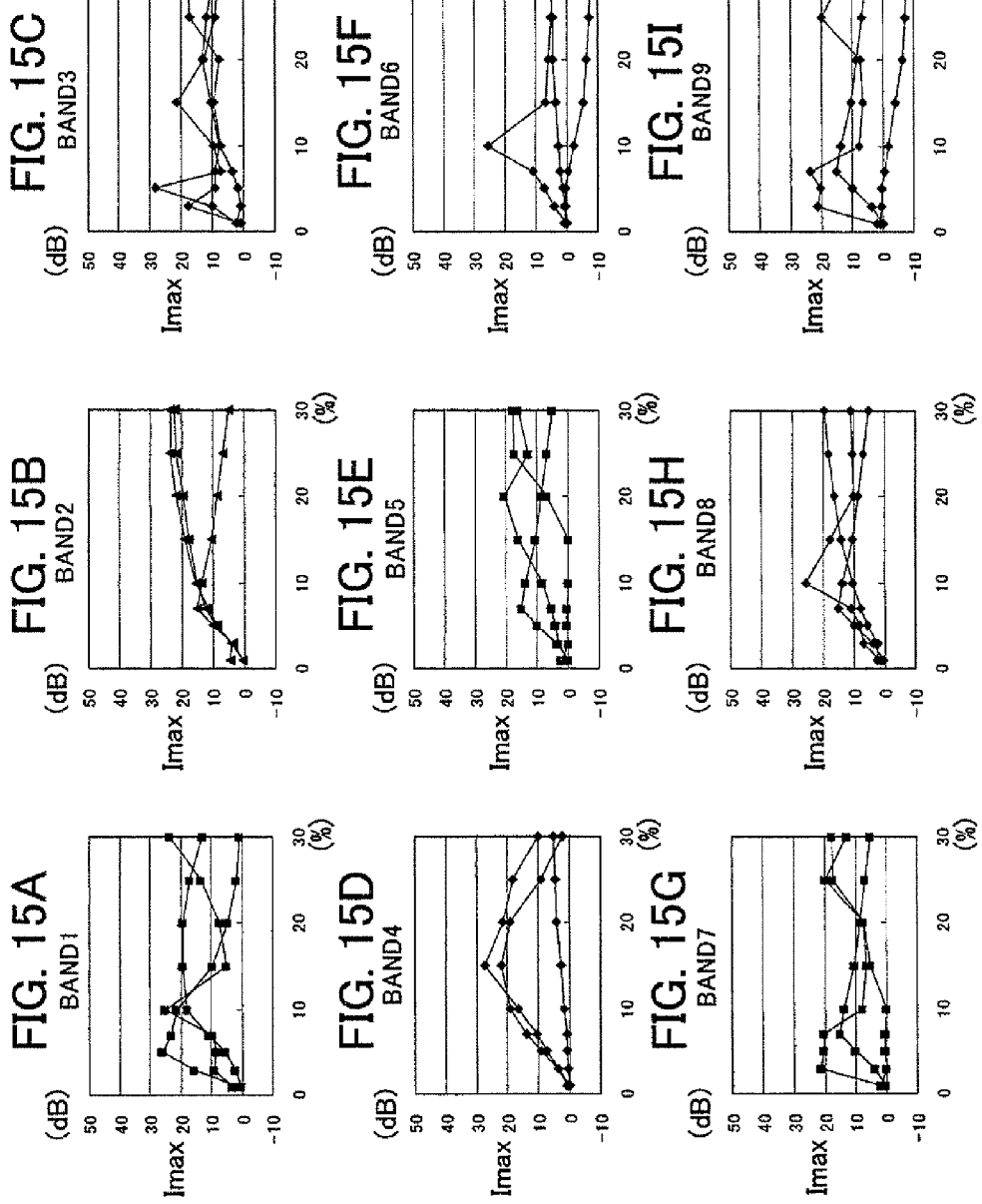

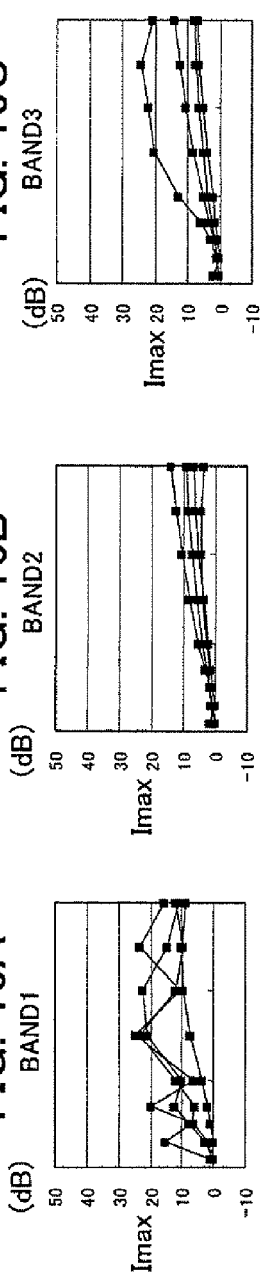

SURFACE ACOUSTIC WAVE DEVICE

CROSS-REFERENCE TO THE RELATED APPLICATIONS

This application is a national stage of international application No. PCT/JP2010/064422, filed on Aug. 25, 2010, and claims the benefit of priority under 35 USC 119 to Japanese Patent Application No. 2009-194412, filed on Aug. 25, 2009, the entire contents of which are incorporated herein by reference.

TECHNICAL FIELD

The present invention relates to a surface acoustic wave device (SAW device) utilizing a surface acoustic wave (SAW).

BACKGROUND ART

A SAW device which has a surface acoustic wave filter (SAW filter) configured by IDT (InterDigital Transducer) electrodes arranged along the propagation direction of the SAW is known (for example the patent literature 1). Each IDT electrode has a plurality of electrode fingers which extend orthogonal to the propagation direction of the SAW and are arranged along the propagation direction of the SAW. The pitches of the plurality of electrode fingers (electrode finger pitches) are suitably set in accordance with a frequency of a passband or the like.

As disclosed in the patent literature 1 as well, in such a SAW device, as a means for increasing an amount of out-of-band attenuation at a low frequency side, generally a method of longitudinally connecting (cascade connecting) two SAW filters is employed.

The SAW device which has a plurality of SAW filters which are connected in multiple stages becomes larger in size along with an increase of the number of SAW filters. Further, the patent literature 1 does not allude to the pitch which contributes to an increase of the amount of out-off-band attenuation.

Therefore, a surface acoustic wave device able to increase the amount of out-of-band attenuation with a compact configuration is preferably provided.

CITATION LIST

Patent Literature

Patent Literature 1: Japanese Patent Publication (A) No. 2006-333171

SUMMARY OF INVENTION

A surface acoustic wave device according to one embodiment of the present invention comprises a piezoelectric substrate and a surface acoustic wave filter comprising a plurality of IDT electrodes which are provided on the piezoelectric substrate and are arranged along a propagation direction of a surface acoustic wave, wherein each of the plurality of IDT electrodes comprises a group of electrode fingers which extend in a direction orthogonal to the propagation direction and which are arranged along the propagation direction spaced apart from each other at predetermined intervals, a first IDT electrode included in the plurality of IDT electrodes has a first wide pitch section including first and second electrode fingers adjacent to each other in the group of electrode fingers, and an interval between the first electrode finger and the second electrode finger is larger than an average value of intervals of the remaining electrode fingers in the group of electrode fingers.

According to the surface acoustic wave device explained above, since the first IDT electrode included in the plurality of IDT electrodes has the first wide pitch section including the first and second electrode fingers adjacent to each other in the electrode finger group, and the interval between the first electrode finger and the second electrode finger is made larger than the average value of intervals of the remaining electrode fingers in the electrode finger group, the amount of out-of-band attenuation can be made larger with a compact configuration.

BRIEF DESCRIPTION OF DRAWINGS

FIG. 4 FIG. 4A and FIG. 4B are views explaining the effects of the SAW device in FIG. 1.

FIG. 7 FIG. 7A to FIG. 7C are views explaining simulation conditions according to a second example of the present invention.

FIG. 8 A table explaining frequencies according to the simulation conditions of the second example.

FIG. 9 FIG. 9A and FIG. 9B are graphs showing the simulation results of the second example.

FIG. 10 FIG. 10A and FIG. 10B are graphs showing other simulation results of the second example.

FIG. 11A to FIG. 11I are graphs showing degrees of improvement of the amount of attenuation obtained by analyzing the simulation results of FIGS. 9A, 9B, 10A, and 10B.

FIG. 13A to FIG. 13I are graphs showing degrees of deterioration of insertion loss obtained by analyzing the simulation results of FIGS. 9A, 9B, 10A, and 10B.

FIG. 14 FIG. 14A and FIG. 14B are graphs showing still other simulation results of the second example.

FIG. 15 FIG. 15A to FIG. 15I are graphs showing the degree of improvement of the amount of attenuation obtained by analyzing the simulation results of a third example.

FIG. 16 FIG. 16A to FIG. 16I are graphs showing the degree of improvement of the amount of attenuation obtained by analyzing the simulation results of a fourth example.

FIG. 26 FIG. 26A is an enlarged view of a region XXVIa in FIG. 25.

FIG. 29 FIG. 29A is an enlarged view of a region XXIXa in FIG. 28.

DESCRIPTION OF EMBODIMENTS

Below, an embodiment of the present invention is explained with reference to the drawings. Note that the drawings which are referred to below are schematic ones. The dimensions, ratios, etc. on the drawings do not necessarily match with the actual ones. Further, in the following drawings, the same or similar configurations are sometimes assigned the same notations and their explanations are omitted.

Figure 1:
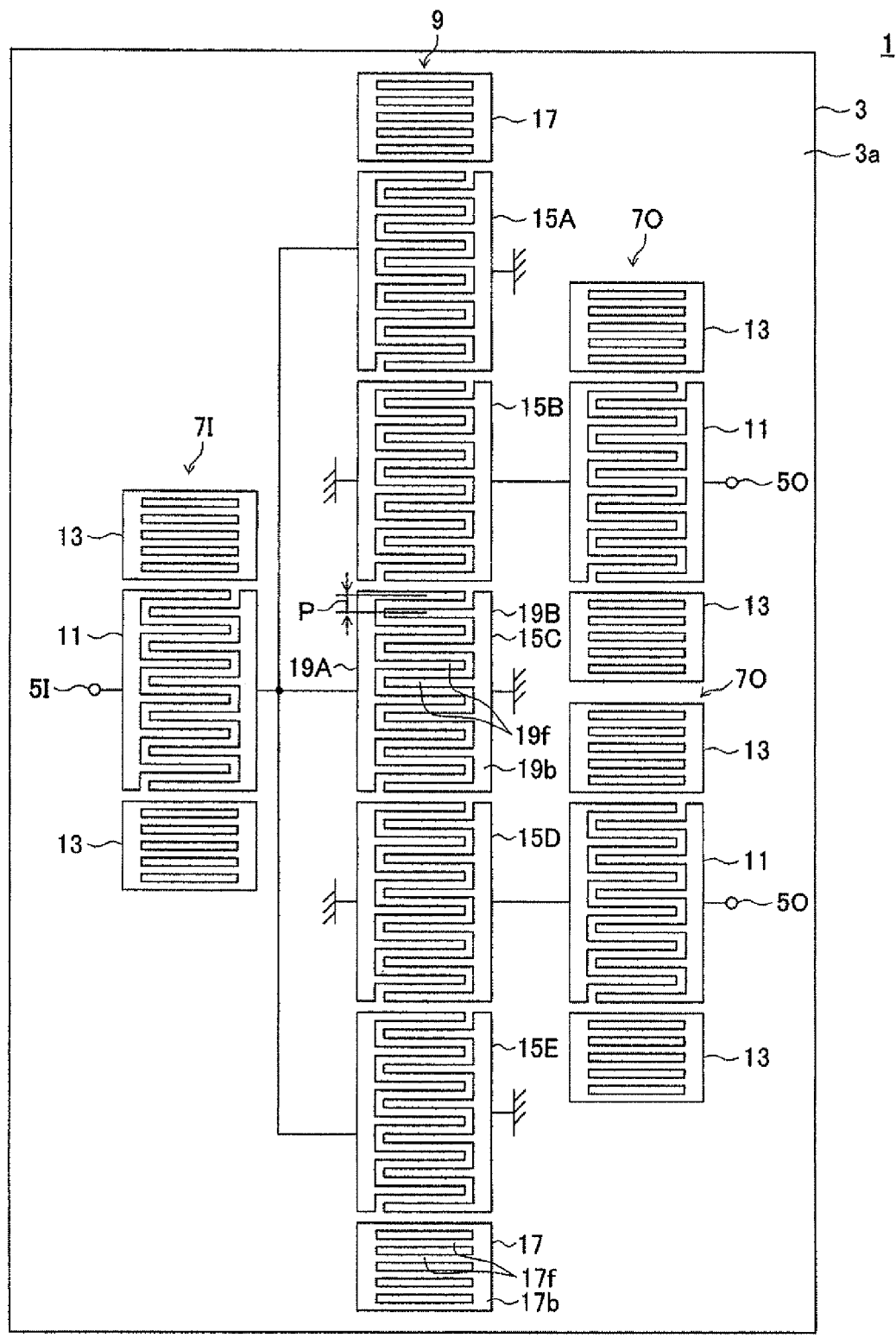
FIG. 1 A plan view showing a SAW device according to an embodiment of the present invention.

FIG. 1 is a plan view showing a SAW device 1 according to the embodiment of the present invention.

The SAW device 1 is configured as a device which filter an input electric signal in the process of conversion of an input electric signal to a SAW and conversion of that SAW to an electric signal.

The SAW device 1 has a substrate 3 through which the SAW is propagated and a plurality of surface acoustic wave elements (SAW elements) which generate the SAW in the substrate 3 based on the input electric signal and detect that SAW such as an input side resonator 7I a filter 9, and an output side resonator 7O.

Further, the SAW device 1 has an input terminal 5I into which a signal is inputted to be filtered and an output terminal 5O which outputs the filtered signal. Other than this, the SAW device 1 also has a cover which forms a space above the SAW elements while covering the SAW elements and so on, but illustration will be omitted.

Note that, below, sometimes the input side resonator 7I and output side resonator 7O are simply referred to as the "resonators 7" and the two are not distinguished. Further, sometimes the input terminal 5I and output terminal 5O are simply referred to as the "terminals 5" and the two are not distinguished.

The substrate 3 is a so-called piezoelectric substrate which is configured by a piezoelectric material exhibiting a piezoelectric effect. The piezoelectric material is for example LiNbO$_3$ or LiTaO$_3$. The substrate 3 has a first main surface 3$a$ facing the front of the sheet surface in FIG. 1 and a not shown second main surface facing the back surface. Note that, the planar shape of the substrate 3 may be suitably set.

The SAW is excited by the SAW elements (7, 9) and propagates through the first main surface 3$a$ in an up-down direction of the sheet surface in FIG. 1. Below, sometimes the up-down direction of the sheet surface in FIG. 1 is referred to as the "propagation direction of the SAW" and the left-right direction of the sheet surface in FIG. 1 is referred to as the "direction orthogonal to the propagation direction of the SAW".

The input side resonator 7I is configured by for example a 1-port type resonator. Specifically, the input side resonator 7I has an IDT electrode 11 and reflectors 13 which are arranged on the two sides of the IDT electrode 11 along the propagation direction of the SAW. The configurations of the IDT electrode 11 and reflectors 13 are the same as the configurations of the IDT electrodes and reflectors of the filter 9 which are explained later, so the explanation is omitted. The input side resonator 7I outputs an unbalanced signal resonating with an unbalanced signal which was input from the input terminal 5I.

The filter 9 is configured by for example a cascade-connected double-mode type resonator surface acoustic wave filter. Specifically, the filter 9 has first IDT electrode 15A to fifth IDT electrode 15E (hereinafter, sometimes simply referred to as the "IDT electrodes 15" and not discriminated) which are arranged along the propagation direction of the SAW and reflectors 17 which are arranged on the two sides of these IDT electrodes 15 along the propagation direction of the SAW.

Each IDT electrode 15 has a first comb-shaped electrode 19A and second comb-shaped electrode 19B (hereinafter, sometimes simply referred to as the "comb-shaped electrodes 19" and not distinguished). Each comb-shaped electrode 19 has a bus bar 19$b$ which extends along the propagation direction of the SAW and an electrode finger group configured by a plurality of electrode fingers 19$f$ which extend from the bus bar 19$b$ in a direction orthogonal to the propagation direction of the SAW. Two comb-shaped electrodes 19 are arranged so that their plurality of electrode fingers 19$f$ mesh with each other.

In the first IDT electrode 15A, third IDT electrode 15C, and fifth IDT electrode 15E, the first comb-shaped electrodes 19A are connected to the input side resonator 7I, and the second comb-shaped electrodes 19B are connected to the ground. Further, in the second IDT electrode 15B and fourth IDT electrode 15D, the first comb-shaped electrodes 19A are connected to the ground, and the second comb-shaped electrodes 19B are connected to the output side resonator 7O. That is, in the filter 9, the IDT electrodes (15A, 15C, 15E) connected to the input side and the IDT electrodes (15B, 15D) connected to the output side are alternately arranged.

Each reflector 17 has two bus bars 17$b$ which extend along the propagation direction of the SAW and a plurality of electrode fingers 17$f$ which extend in a direction orthogonal to the propagation direction of the SAW and are hung from the two bus bars 17$b$.

The filter 9 filters unbalanced signals input from the input side resonator 7I, converts them to balanced signals, and outputs the results to the output side resonator 7O.

The output side resonator 7O is, in the same way as the input side resonator 7I, configured by a 1-port type resonator and has IDT electrodes 11 and reflectors 13. Two output side resonators 7O are provided corresponding to the fact that the filter 9 outputs balanced signals. The two output side resonators 7O output balanced signals to the two output terminals 5O, these signals resonating with the balanced signals input from the filter 9.

Figure 2:
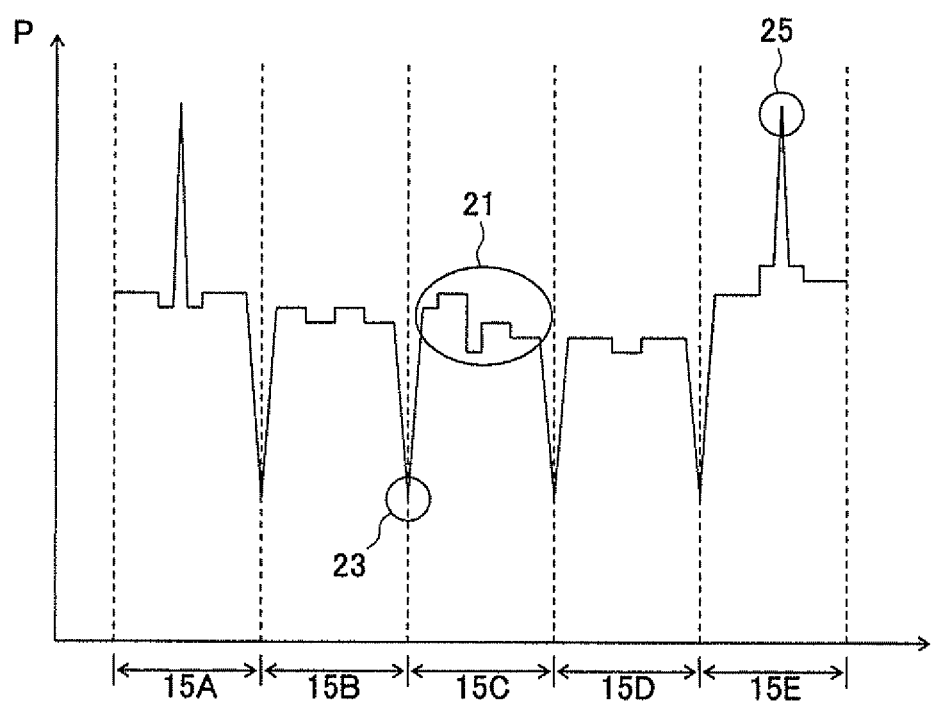
FIG. 2 A graph showing the electrode finger pitch of the SAW device of FIG. 1.

FIG. 2 is a graph showing intervals of the electrode fingers of the first IDT electrode 15A to the fifth IDT electrode 15E of the filter 9, that is, the electrode finger pitch P.

The "electrode finger pitch" means, as indicated by notation P in FIG. 1, the distance between center lines of adjacent electrode fingers 19$f$. In FIG. 2, an abscissa indicates the position of the filter 9 in the propagation direction of the SAW (number of electrode finger pitches). Note that, the ranges corresponding to the first IDT electrode 15A to the fifth IDT electrode 15E are assigned these notations (15A to 15E). An ordinate indicates the electrode finger pitch.

Each IDT electrode 15 has a main pitch section 21 which occupies most of the IDT electrode 15 and narrow pitch sections 23 located at boundary parts with the adjacent IDT electrodes 15.

The electrode finger pitches of the main pitch section 21 are approximately set to about half of the wavelength corresponding to the frequency of the signal to be passed. However, the electrode finger pitches of the main pitch section 21 fluctuate within a relatively minute range so that a desired filter characteristic is obtained.

The narrow pitch sections 23 are provided for the purpose of broadening the bandwidth, lowering the insertion loss, and so on. The electrode finger pitches of the narrow pitch section 23 are narrower than all or the average of the electrode finger pitches of the main pitch section 21 and have a size of for example about 4/5 of the average of the electrode finger pitches of the main pitch section 21.

In the present embodiment, further, in order to increase the amount of attenuation out of the passband, the IDT electrodes (15A and 15E) on the two ends have wide pitch sections 25 in their main pitch sections 21.

The wide pitch sections 25 are provided for example at centers of the IDT electrodes 15 on the two ends. The electrode finger pitch of each wide pitch section 25 is larger than the average value of the electrode finger pitches of portions other than the wide pitch section 25. For example, this is made larger by a ratio of 4% to 30% of the average value relative to the average value of the electrode finger pitches of portions other than the wide pitch section 25.

Figure 3:
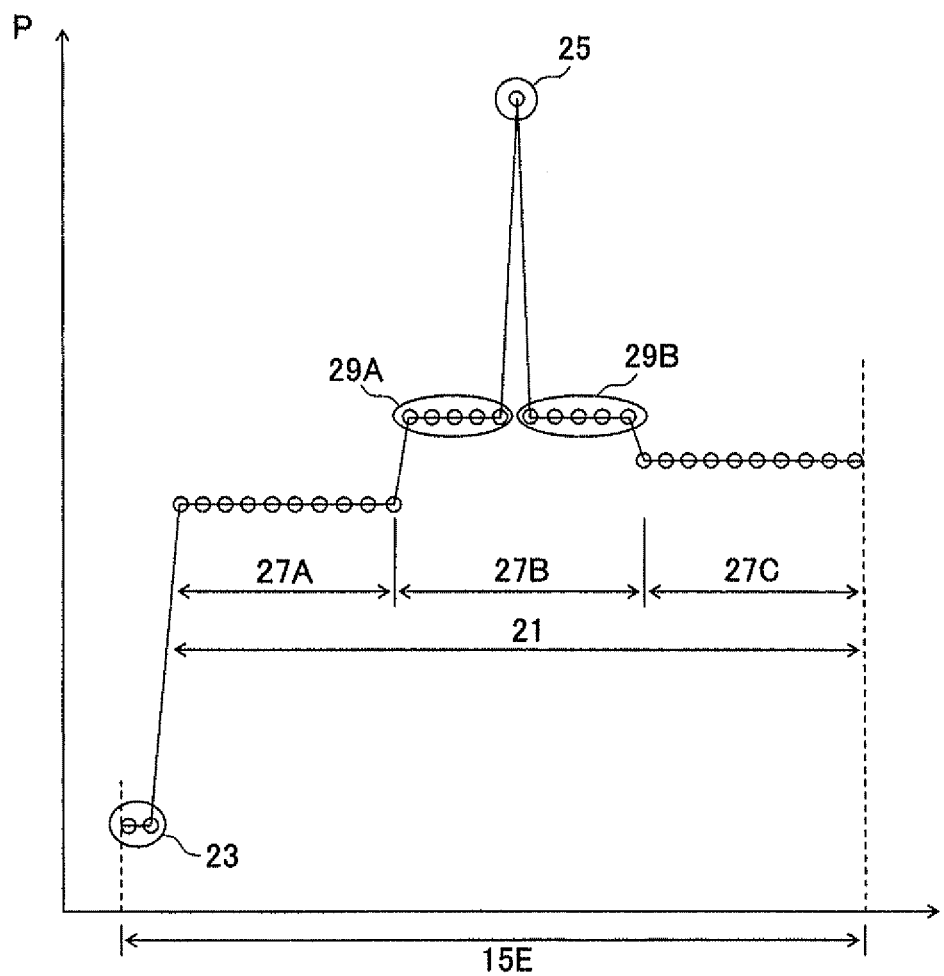
FIG. 3 A partially enlarged view of the graph in FIG. 2.

FIG. 3 is an enlarged diagram of a portion of FIG. 2, specifically in a range of the fifth IDT electrode 15E. In FIG. 2, positions in the propagation direction of the SAW and sizes of the electrode finger pitches were indicated by only lines. However, in FIG. 3, dots (marks) corresponding to the electrode finger pitches are shown as well.

The main pitch section 21 has a plurality of constant pitch sections in which the electrode finger pitch is basically (except the wide pitch section 25) constant (in the example of FIG. 3, a first constant pitch section 27A, second constant pitch section 27B, and third constant pitch section 27C, hereinafter, sometimes simply referred to as the "constant pitch sections 27").

The number of electrode fingers configuring each constant pitch section 27 is for example 10 to 20. Note that, in the constant pitch sections 27, the sizes of the plurality of spaces between the electrode fingers are the same as each other, but fluctuate within a range of tolerance.

The adjacent constant pitch sections 27 are different from each other in the magnitude of the electrode finger pitch. That is, as explained above, in the main pitch section 21, the electrode finger pitch fluctuates within a relatively minute range so that the desired filter characteristic is obtained, and this fluctuation is realized using the constant pitch section 27 as the minimum unit.

A wide pitch section 25 is provided in the constant pitch section 27 (second constant pitch section 27B in FIG. 3) which is located at the center of the fifth IDT electrode 15E. Further, the wide pitch section 25 is provided at the center of the second constant pitch section 278. In the wide pitch section 25, there is only one electrode finger pitch. In other words, the number of electrode fingers which configure the wide pitch section 25 is two. The two electrode fingers configuring the wide pitch section 25 are one embodiment of the first electrode finger and second electrode finger of the present invention.

As shown in FIG. 3, between a first pitch section 29A having a constant electrode finger pitch and a second pitch section 29B in which the electrode finger pitch is constant and is same as the electrode finger pitch of the first pitch section 29A, the wide pitch section 25 is adjacent to the first pitch section 29A and to the second pitch section 29B. Further, in the wide pitch section 25, the electrode finger pitch is broader and the number of electrode finger pitches is smaller than the first pitch section 29A and second pitch section 29B.

Figure 4A:
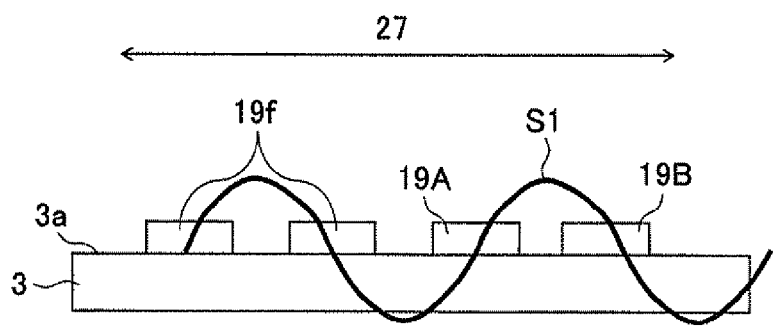
Figure 4B:
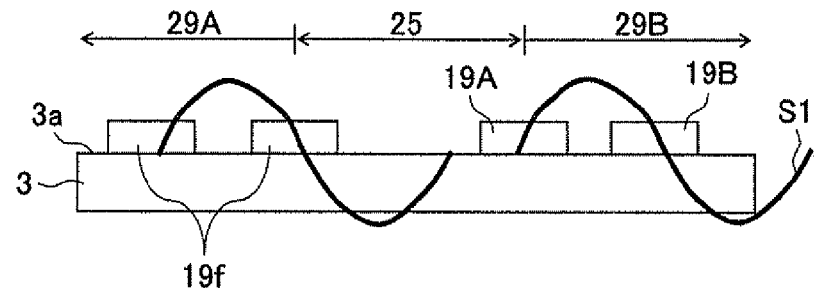

FIGS. 4A and 4B are views schematically explaining the operation of the wide pitch section 25. FIG. 4A is a cross-sectional view of a constant pitch section 27 which does not have a wide pitch section 25. FIG. 4B is a cross-sectional view of a constant pitch section 27 which has a wide pitch section 25.

The curves indicated by the solid lines S1 in FIG. 4A and FIG. 4B show the SAW corresponding to the signals to be eliminated. As shown in FIG. 4A, in the constant pitch section 27 which does not have a wide pitch section 25, the electrode fingers 19f have certain widths and so on. Accordingly, not only a SAW corresponding to a signal of the passband, but also a SAW corresponding to a signal to be eliminated may be propagated.

However, as shown in FIG. 4B, by insertion of the wide pitch section 25, the deviation between the half wavelength of the SAW corresponding to the signal to be eliminated and the electrode finger pitch becomes large and propagation of that SAW is obstructed. Accordingly, increase of the amount of out-of-band attenuation can be expected. Note that, since the number of the electrode fingers configuring the wide pitch section 25 is two, deterioration of the insertion loss is suppressed.

EXAMPLES

First Example

The SAW device 1 of the embodiment was specifically designed, then a model created and simulation carried out. Below, the conditions and results of the simulation are shown.

Figure 5:
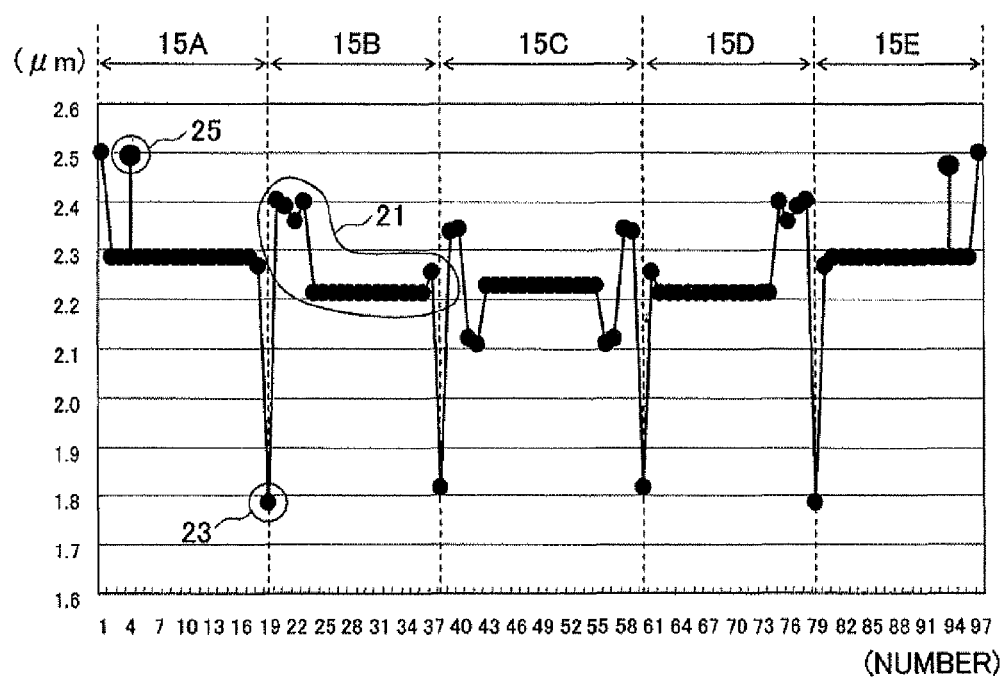
FIG. 5 A graph showing the electrode finger pitches under simulation conditions according to a first example of the present invention.

FIG. 5 is a graph showing the electrode finger pitch under the simulation conditions. The abscissa shows the position of the filter 9 in the propagation direction of the SAW according to the number of the electrode finger pitches. The ordinate shows the magnitude of the electrode finger pitch.

In the electrode finger pitch under the simulation conditions, fluctuation of the main pitch section 21 is simplified more than that in actual electrode finger pitch. Further, wide pitch sections 25 are arranged at positions deviated to the outside from the centers in the IDT electrodes (15A, 15E) on the two ends.

Figure 6:
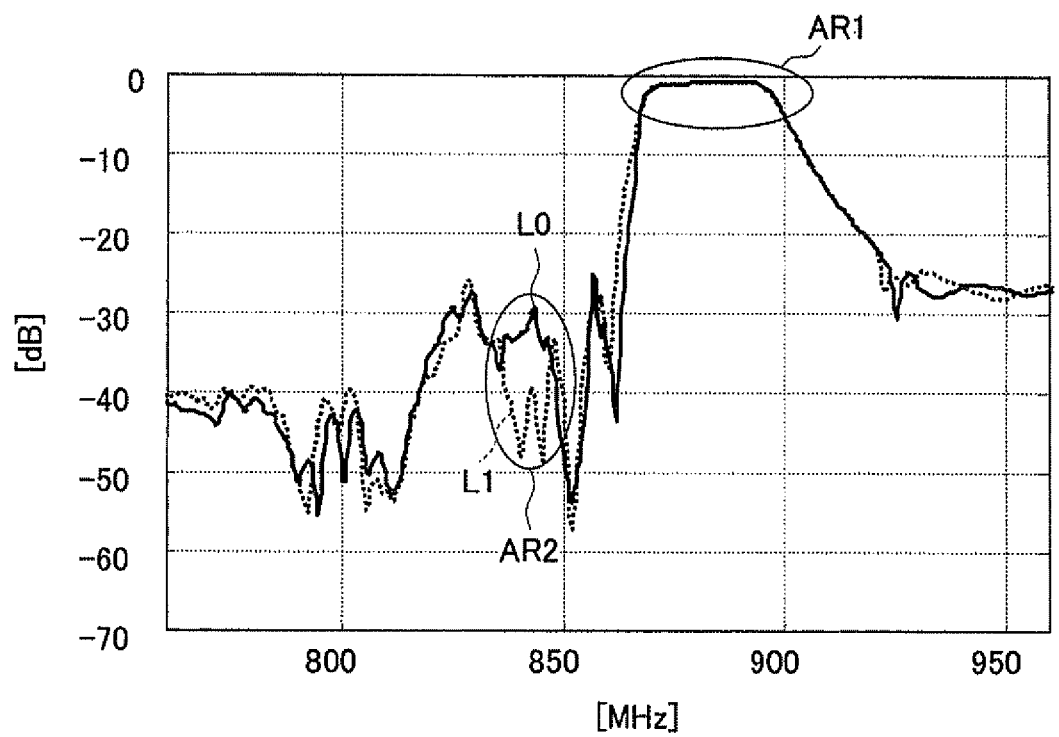
FIG. 6 A graph showing a simulation result of the first example.

FIG. 6 is a graph showing the simulation results. The abscissa shows the frequency. The ordinate shows the amount of attenuation of the signal. A solid line L0 indicates the simulation results in a case where a wide pitch section 25 is not provided (comparative example), while a dotted line L1 indicates the simulation results in a case where the wide pitch section 25 is provided (first example).

As shown in an area AR1 (about 870 to 900 MHz), in the example, in the same way as the comparative example, almost no deterioration of insertion loss in the passband occurs. On the other hand, as shown in an area AR2 (about 830 to 850

MHz), the amount of out-of-band attenuation in the example becomes larger than the amount of out-of-band attenuation in the comparative example.

Second Example

The inventors ran simulations while changing the conditions in various ways and obtained findings concerning preferred embodiments of the magnitude of electrode finger pitch of the wide pitch section 25, insertion position of the wide pitch section 25, and so on. Specifically, these were as follows.

(Simulation Conditions)

Figure 7A:
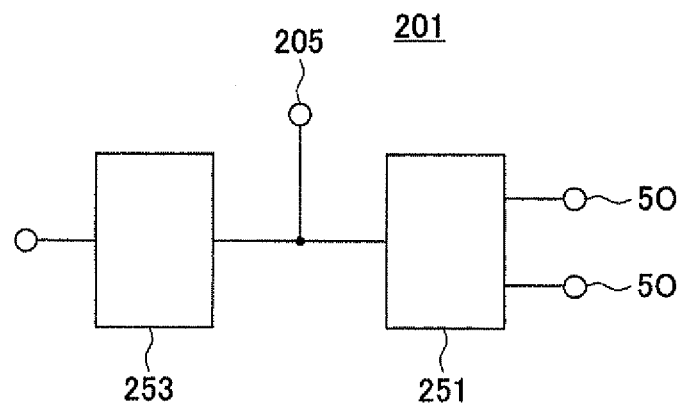

FIG. 7A is a schematic view of a SAW device 201 of the second example.

The SAW device 201 is configured as a duplexer and has a receiving filter section 251, a transmitting filter section 253, and an antenna terminal 205 shared by these filter sections.

The receiving filter section 251 is configured, for example, in the same way as the SAW device 1 of the embodiment, so that a cascade-connected double-mode type resonator SAW filter is included. The transmitting filter section 253 is for example configured so that a ladder-type SAW filter is included. In the second example, the simulation is carried out for the receiving filter section 251.

Figure 7B:
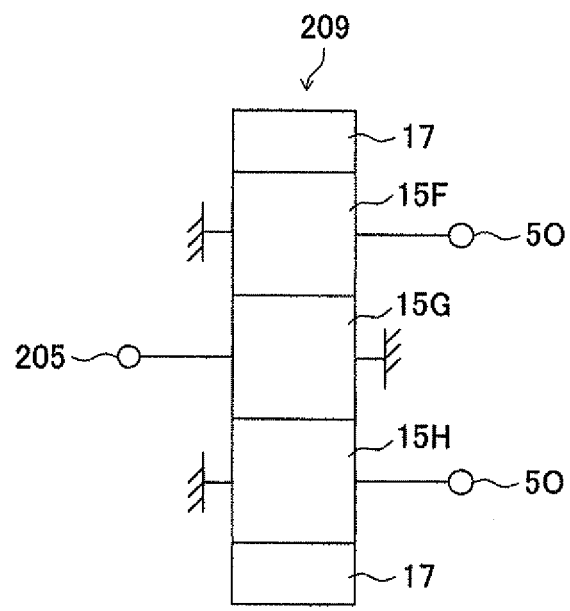

FIG. 7B is a schematic view showing a filter 209 of the receiving filter section 251.

While the filter 9 of the embodiment had five IDT electrodes 15, the filter 209 of the second example has three IDT electrodes 15F, 15G, and 15H. Further, a resonator 7 is not provided in the filter 209 of the second example. The configuration of the filter 209 other than that is substantially the same as the configuration of the filter 9. Further, the antenna terminal 205 functions as the input terminal 51 in the embodiment.

Figure 7C:
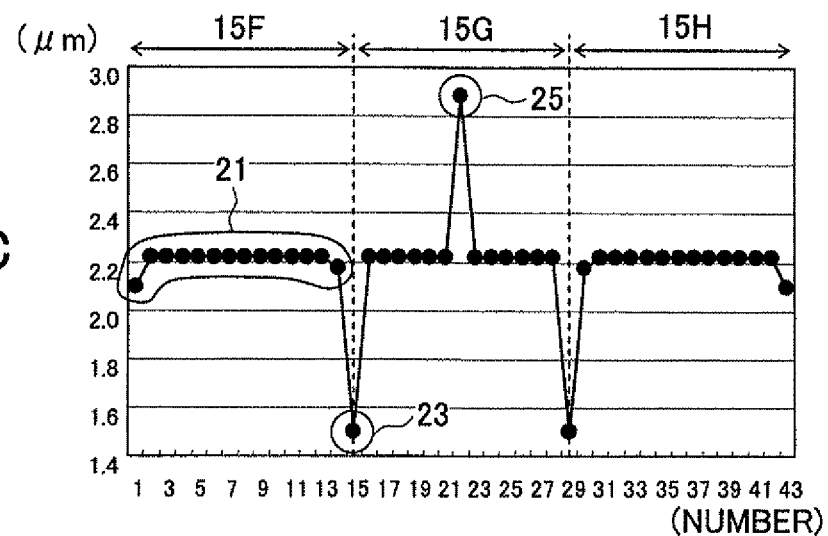

FIG. 7C is a graph showing the electrode finger pitch under simulation conditions and is a graph similar to FIG. 5.

Each IDT electrode 15 of the filter 209, in the same way as the embodiment, has a main pitch section 21 and narrow pitch sections 23. Further, the main pitch section 21 of the filter 209 has a wide pitch section 25.

Note that, FIG. 7C exemplifies a case where the wide pitch section 25 is provided at the center of the center IDT electrode 15G. However, in the simulations of the second example, the insertion position of the wide pitch section 25 is suitably changed for realization of various simulation cases.

Further, FIG. 7C exemplifies a case where the space between the two electrode fingers configuring the wide pitch section 25 (the magnitude of the electrode finger pitch) is made larger by a ratio of 30% relative to the average value of the magnitudes of electrode finger pitches of portions (including the narrow pitch sections 23) other than the wide pitch section 25. Specifically, in FIG. 70, with respect to the average value 2.18 μm of the pitches of the remaining electrode fingers other than the wide pitch section 25 of the center IDT electrode, the pitch between the two electrode fingers configuring the wide pitch section 25 is 2.83 μm.

However, the width of the wide pitch section 25 is also suitably changed for realization of various simulation cases.

FIG. 8 is a diagram showing the frequency according to the simulation conditions.

In the simulation of the second example, it is assumed that the SAW device 201 is used in a UMTS (Universal Mobile Telecommunication System).

The rows "UMTS" at the upper half of FIG. 8 show the frequencies used in a UMTS for the different bands ("BAND 1" to "BAND 9").

The column "Tx" shows the frequencies used for transmission, while the column "Rx" shows the frequencies used for reception. In the columns "Tx" and "Rx", the columns "L" show the lower limits of passbands, the columns "U" show the upper limits of passbands, the columns "W" show widths of passbands, and the columns "W/C" show ratios of the widths of passbands with respect to the center value (median) of passband.

Note that, as understood from the frequencies shown in the columns "Tx" and "Rx", in each band, the passband of reception ("Rx") is higher in frequency than the passband of reception ("Tx").

The column "Tx-Rx Gap" shows the relationships between the passbands of transmission and the passbands of reception. Specifically, the column "Lr-Ut" shows the differences between the upper limits of passband of transmission and the lower limits of passband of reception. In other words, it shows the widths of the frequency bands between the passbands of transmission and the passbands of reception. Further, the column "Gap/C_TxRx" shows the ratios of the widths of frequency bands between the passbands of transmission and the passbands of reception with respect to the center values of the frequency bands between them.

As indicated in the row "UMTS", a plurality of bands are used in a UMTS. Setting electrode finger pitches corresponding to each band and performing simulation for each band entails enormous work.

Therefore, in the second example, the frequency of each of the bands of a UMTS is normalized, and the normalized frequency is used as the basis for construction of a simulation model and evaluation of the simulation results. Therefore, simulation can be carried out common to the bands.

The rows "Nrml" at the lower half in FIG. 8 show the normalized frequencies in the same way as the rows of "UMTS".

The normalization is carried out so that the values of the column "W/C" in "Rx" and the values of the column "Gap/C_TxRx" in "Tx-Rx Gap" coincide before normalization ("UMTS") and after normalization ("Nrml").

As a result of the normalization, in "BAND 1" to "BAND 9" in "Nrml", the frequency bands of "Rx" overlap each other. Further, in "BAND 1" to "BAND 9" in "Nrml", the frequency bands of "Tx" overlap or are close to each other as well.

In the simulation, "Rx" in "Nrml" shows the passbands. Further, "Tx" in "Nrml" shows the frequency bands for which an increase in the amount of attenuation is desired from the viewpoint of improvement in the function as a duplexer.

First, a plurality of simulations were carried out while changing the conditions as follows.

(Condition 1: Position of Wide Pitch Section 25)

Two types of IDT electrodes at the two ends (15F and 15H) or the IDT electrode (15G) at the center (Condition 2: Pitch of Two Electrode Fingers Configuring the Wide Pitch Section 25)

Nine types of cases where the magnitude of electrode finger pitch of the wide pitch section 25 is made larger than the average of the magnitudes of the electrode finger pitches of portions (including the narrow pitch sections 23 as well) other than the wide pitch section 25 by ratios of 1%, 3%, 5%, 7%, 10%, 15%, 20%, 25%, and 30%.

(Number of Simulation Cases)

Condition 1×condition 2=18 cases

Note that it is assumed that the wide pitch section 25 is provided at the center of the IDT electrode 15 at which the wide pitch section 25 is provided.

Further, the simulation was carried out even for a case where the wide pitch section 25 was not provided.

(Simulation Results)

Figure 9A:
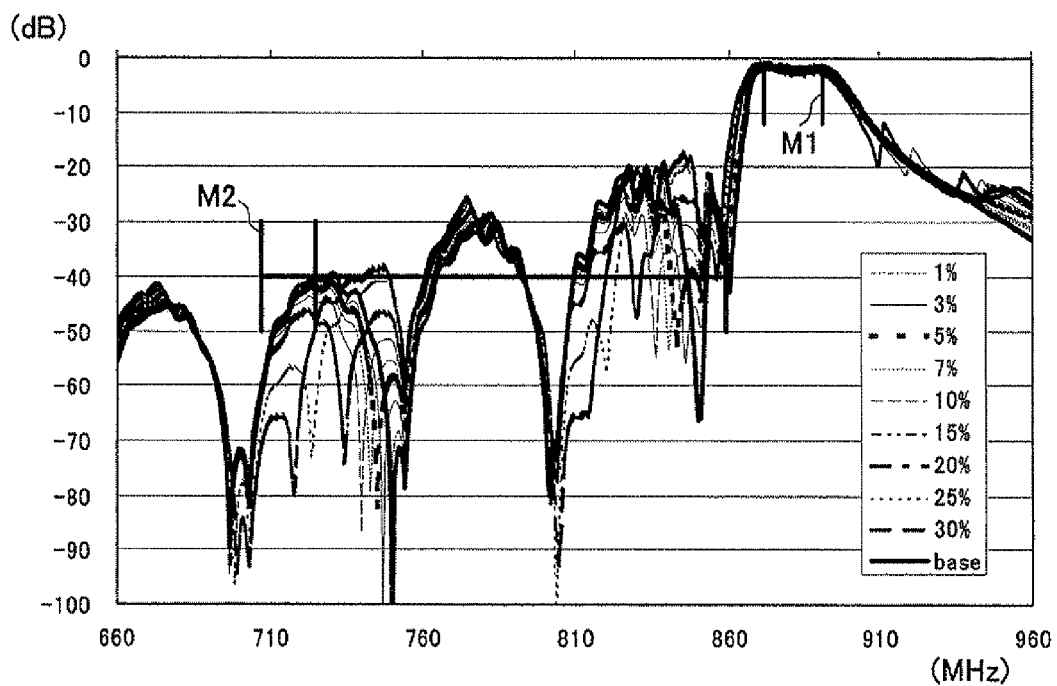
Figure 9B:
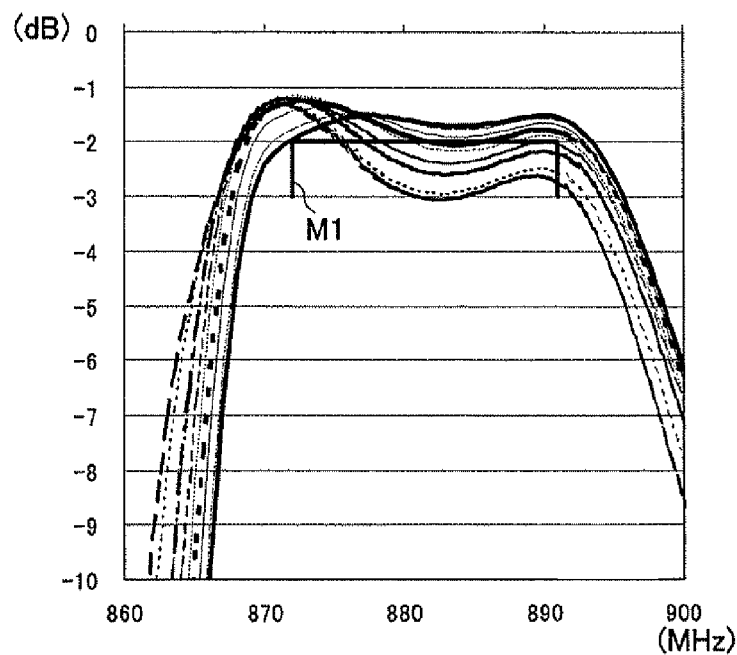

FIG. 9A shows the simulation results in a case where wide pitch sections 25 are provided in the IDT electrodes at the two ends (15F and 15H). Further, FIG. 9B is an enlarged diagram of the periphery of the passband in FIG. 9A.

Figure 10A:
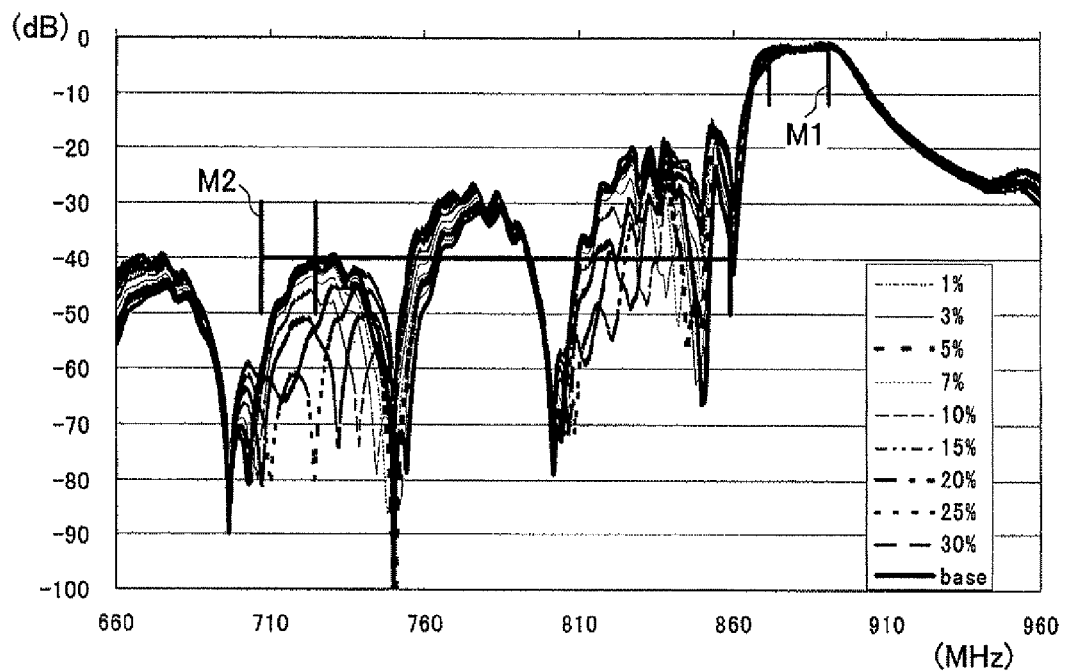
Figure 10B:
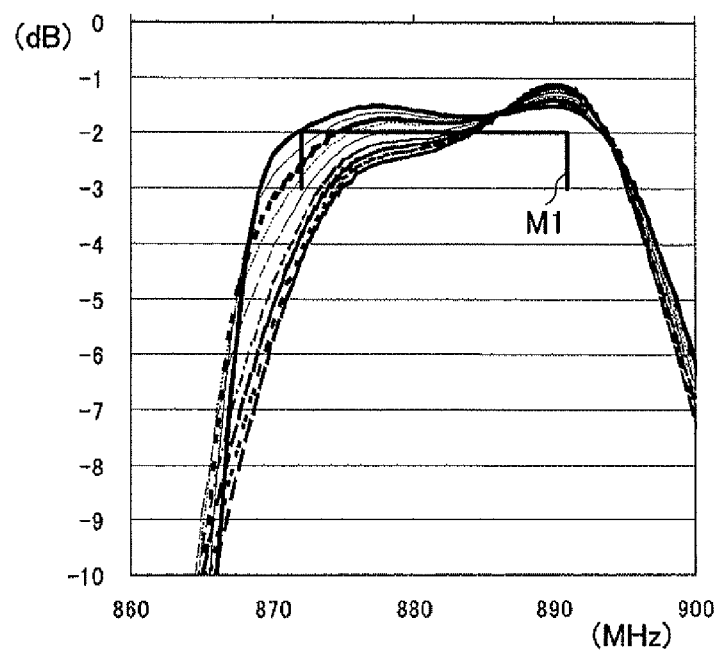

FIG. 10A shows the simulation results in a case where a wide pitch section 25 is provided in the IDT electrode at the center (15G). Further, FIG. 10B is an enlarged diagram of the periphery of the passband in FIG. 10A.

The curve indicated as "base" corresponds to the simulation case where the wide pitch section 25 is not provided. The plurality of curves indicated as "(numerical value) %" other than that correspond to the simulation cases where the condition 2 is changed.

In FIGS. 9A, 9B, 10A, and 10B, the abscissas show the frequencies, and the ordinates show the amounts of attenuation. Further, marks M1 show the standard positions of the passbands, and marks M2 (FIG. 9A and FIG. 10A) show the standard positions of the frequency bands for which an increase in the amount of attenuation is desired.

It can be seen from FIG. 9 and FIG. 10 that, in most of the simulation cases, if a wide pitch section 25 is provided, the amount of out-of-band attenuation increases, but on the other hand the insertion loss does not become that large.

Note, it is also suggested that there is difference in the frequency at which attenuation is obtained and the amount of attenuation etc. by changing the condition 1 and condition 2. That is, it is also suggested that there is room of study of the selection of the IDT electrode 15 at which the wide pitch section 25 is provided and the setting of the magnitude of the electrode finger pitch of the wide pitch section 25.

(Analysis Concerning Improvement of Amount of Attenuation)

The inventors analyzed the simulation results described above and calculated the degree of improvement compared with the case where the wide pitch section 25 was not provided for each of the 18 simulation cases.

As an indicator showing the degree of improvement, the inventors calculated the average of the differences between the amounts of attenuation where the wide pitch section 25 was not provided and the amounts of attenuation where the wide pitch section 25 was provided in the frequency bands where securing attenuation is desired (average value Ia of improvement).

The frequency bands where securing attenuation is desired described above are the frequency bands indicated in the column "Tx" in the row "Nrml" in FIG. 8. The frequency band differs for each of "BAND 1" to "BAND 9", therefore the average value Ia of improvement was calculated for each of "BAND 1" to "BAND 9".

In FIGS. 11A to 11I are graphs showing the average values Ia of improvement. FIG. 11A to FIG. 11I correspond to "BAND 1" to "BAND 9" as shown at the tops of the graphs.

In FIG. 11, the abscissas show the magnitudes of the IDT electrode pitches of the wide pitch sections 25 (condition 2). The ordinates show the average values Ia of improvement. Further, the solid lines L21 indicate the case where the wide pitch sections 25 are provided in the IDT electrodes at the two ends (15F and 15H), while the solid lines L22 show the case where the wide pitch section 25 is provided at the IDT electrode at the centers (15G).

As shown in these graphs, it can be substantially seen that the amount of attenuation increases when the electrode finger pitch of the wide pitch section 25 is broadened, and the amount of attenuation falls when the electrode finger pitch of the wide pitch section 25 is further broadened.

Note that, in some graphs such as FIG. 11D, no change of the amount of attenuation as described above is caused. The reason for this can be considered to be that the frequency bands being evaluated (the frequency bands shown in the column "Tx" of the row "Nrml") are extremely small compared with those in the other graphs.

Figure 12:
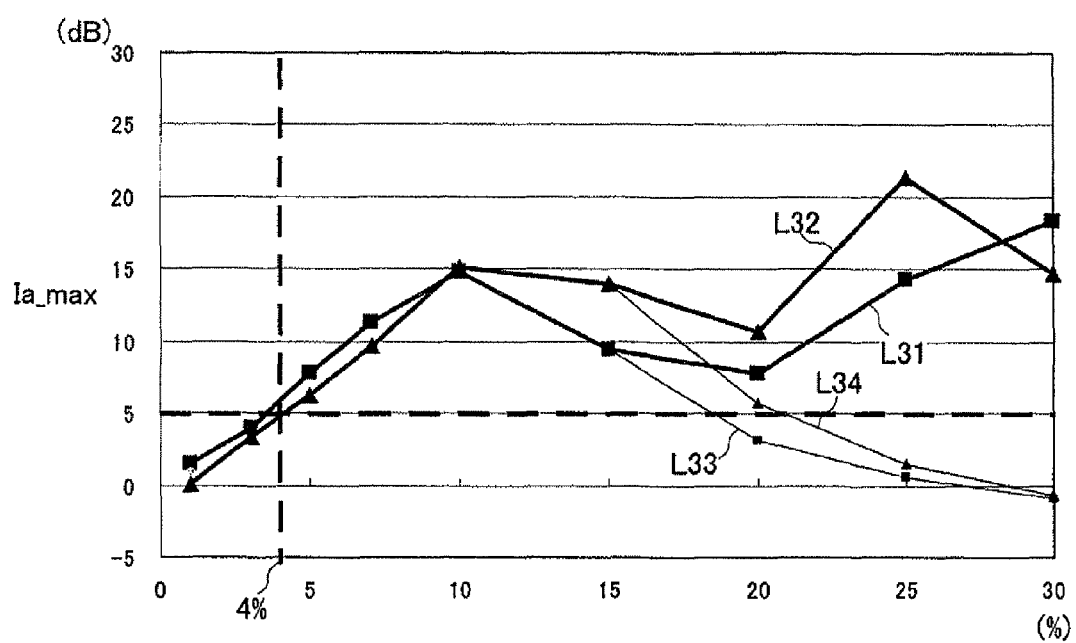
FIG. 12 A graph showing an influence of an electrode finger pitch of a wide pitch section upon a degree of improvement of the amount of attenuation obtained by further analyzing the analysis results of FIGS. 11A to 11I.

FIG. 12 is a graph showing the influence of the magnitude of the electrode finger pitch of the wide pitch section 25 exerted upon the degree of improvement of the amount of attenuation as obtained by further analyzing the results of analysis shown in FIGS. 11A to 11I.

Specifically, the maximum values (maximum values Ia_max of the average values of improvement) in all bands ("BAND 1" to "BAND 9") of the average values Ia of improvement shown in FIGS. 11A to 11I were found for the 18 simulation cases.

Note that, as explained above, for the average value Ia of improvement concerning the "BAND 4" (FIG. 11D), a change occurs which is different from the changes of the average values Ia of improvement of the other bands. Therefore, the maximum value Ia_max of the average value of improvement was also found for the remaining bands after excluding the "BAND 4" from all bands.

The abscissa in FIG. 12 shows the magnitude of electrode finger pitch of the wide pitch section 25 (condition 2). The ordinate shows the maximum value Ia_max of the average values of improvement. Further, the solid line L31 shows the maximum values of all bands in the case where the wide pitch sections 25 are provided in the IDT electrodes at the two ends (15F and 15H). The solid line L32 shows the maximum values of all bands in the case where the wide pitch section 25 is provided in the IDT electrode at the center (15G). The solid line L33 shows the maximum values of the remaining bands obtained after excluding the "BAND 4" in the case where the wide pitch sections 25 are provided in the IDT electrodes at the two ends (15F and 15H). The solid line L34 shows the maximum values of the remaining bands obtained after excluding the "BAND 4" in the case where the wide pitch section 25 is provided in the IDT electrode at the center (15G).

It is confirmed from the analysis results indicated by the solid lines L31 and L32 that an improvement of the amount of attenuation is obtained in the frequency bands in which securing attenuation is desired in at least one band if the ratio of the amount of increase of the electrode finger pitch of the wide pitch section 25 is 1% to 30%.

It is seen that the attenuation can be improved so long as the ratio of the amount of increase of the wide pitch section 25 is not more than 25% even in the case where the "BAND 4" is excluded.

In the solid lines L31 and L32, an improvement of 5 dB is secured even near 20% where the amount of attenuation falls. If an improvement of 5 dB can be secured, the extent of deterioration in characteristics due to variation in manufacture of surface acoustic wave devices can be absorbed in most cases. Therefore, if considering the effects of the example, "5 dB" becomes one standard. Further, if paying attention to the side where the electrode finger pitch is narrow, it is seen that the attenuation can be improved by 5 dB if the ratio of increase of the electrode finger pitch of the wide pitch section 25 is 4% or more.

(Analysis Concerning Insertion Loss)

The inventors analyzed the above simulation results and, for each of the 18 simulation cases, calculated the degree of degradation of the insertion loss compared with the case where the wide pitch section 25 was not provided.

As an indicator showing the degree of degradation in the insertion loss, the inventors calculated the maximum values (maximum values Lmax of degradation) in the passbands for the differences between the amounts of attenuation in the case where the wide pitch section 25 was not provided and the amounts of attenuation in the case where the wide pitch section 25 was provided.

The passbands are the frequency bands indicated in the column "Rx" of the row "Nrml" in FIG. 8. The frequency band differs for each of "BAND 1" to "BAND 9", therefore the maximum value Lmax of degradation was calculated for each of "BAND1" to "BAND9".

FIGS. 13A to 13I are graphs showing the maximum values Lmax of degradation. FIG. 13A to FIG. 13I correspond to the "BAND 1" to "BAND 9" as shown at the tops of the graphs.

In FIGS. 13A to 13I, the abscissas show the magnitudes of the IDT electrode pitches of the wide pitch section 25 (condition 2). The ordinates show the maximum values Lmax of degradation. Further, the solid lines L41 indicate the case where the wide pitch sections 25 are provided in the IDT electrodes at the two ends (15F and 15H), and the solid lines L42 show the case where the wide pitch section 25 is provided in the IDT electrode at the center (15G).

As shown in these graphs, the degradation of the insertion loss is suppressed more in the case where the wide pitch sections 25 are provided in the IDT electrodes at the two ends (15F and 15H) than the case where the wide pitch section 25 is provided in the IDT electrode at the center (15G).

In order to see the influence of the position of a wide pitch section 25 in the IDT electrode 15 exerted upon the insertion loss, simulation was further carried out. Specifically, a plurality of simulations were run while changing the position of the wide pitch section 25 in the IDT electrode 15 wherein this wide pitch section 25 is to be provided for a case where the ratio of increase of the wide pitch section 25 was 30%.

Figure 14A:
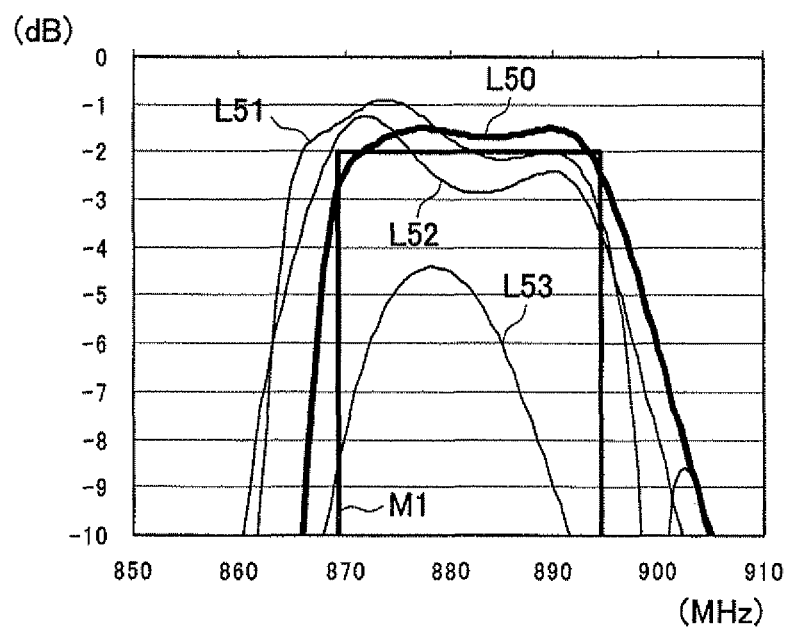

FIG. 14A is a view showing the results of the plurality of simulations which were carried out while changing the positions of the wide pitch sections 25 in the IDT electrodes at the two ends (15F and 15H).

The abscissa shows the frequency, while the ordinate shows the amount of attenuation. The range of the abscissa is the periphery of the passband. The mark M1 indicates the standard position of the passband.

The solid line L50 indicates the simulation results in the case where the wide pitch section 25 is not provided. The solid line L51 indicates the simulation result in a case where, in the IDT electrodes at the two ends (15F and 15H), the wide pitch sections 25 are provided near end portions of the former at the sides opposite to the center IDT electrode (15G). The solid line L52 indicates the simulation results in a case where the wide pitch sections 25 are provided near centers of the IDT electrodes at the two ends (15F and 15H). The solid line L53 indicates the simulation results in a case where, in the IDT electrodes at the two ends (15F and 15H), the wide pitch sections 25 are provided near the end portions of the former at the side of the center IDT electrode (15G).

In this diagram, it can be seen that the insertion loss is relatively large at the time when the wide pitch sections 25 are provided at the side of the center IDT electrode (15G) (solid line L53), while the insertion loss is relatively small at the time when they are provided at positions other than this (solid lines L51 and L52).

Figure 14B:
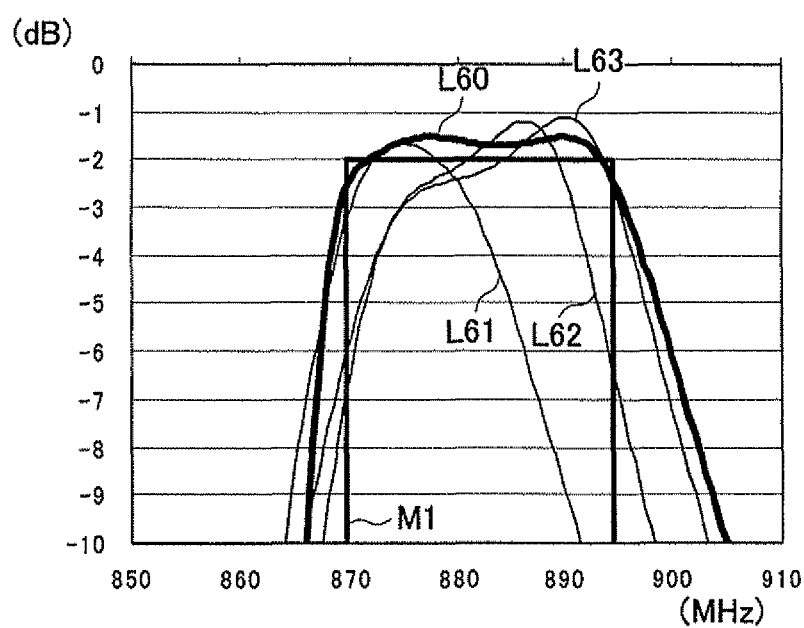

FIG. 14B is a view showing the results of a plurality of simulations which were carried out while changing the position of the wide pitch section 25 in the IDT electrode at the center (15G). The abscissa, ordinate, mark M1, etc. are the same as those in FIG. 14A.

The solid line L60 shows the simulation results in the case where the wide pitch section 25 is not provided. The solid line L61 shows the simulation results in a case where the wide pitch section 25 is provided near the end portion in the center IDT electrode (15G). The solid line L62 shows the simulation results in a case where the wide pitch section 25 is provided near the middle between the center and the end portion in the center IDT electrode (15G). The solid line L63 shows the simulation results in a case where the wide pitch section 25 is provided near the center of the center IDT electrode (15G).

In this diagram, it can be seen that the insertion loss becomes smaller as the position of the wide pitch section 25 becomes nearer the center (solid line L63).

As described above, the filter characteristic differs according to the position of the wide pitch section 25. It is necessary to comprehensively consider also the degree of improvement of attenuation etc. for the optimum position of the wide pitch section 25. However, from the viewpoint of reduction of the insertion loss, it is guessed from these simulation results that the wide pitch section 25 is preferably arranged at the center of the IDT electrode 15 or the like. Note that, when the number of the electrode fingers of an IDT electrode 15 is an odd number, there are an even number of electrode finger pitches. In this case, the wide pitch section 25 may be provided for at least one of the two electrode finger pitches at the two sides of the electrode finger located at the center of the IDT electrode 15.

Note that, if the wide pitch section 25 is provided at the center of the IDT electrode 15, the symmetry in the IDT electrode 15 becomes high, so it is expected that the filter characteristic would be comprehensively improved.

Third and Fourth Examples

In the second example, the simulation was carried out under various conditions for the case of three IDT electrodes 15, and the effect of improvement of attenuation etc. by a wide pitch section 25 was confirmed. However, even when there are other than three IDT electrodes 15, the effect of improvement of attenuation by a wide pitch section 25 is exhibited under various conditions. Specifically, these are as follows.

FIGS. 15A to 15I are graphs showing degrees of improvement obtained by analyzing the simulation results in a case where there are five IDT electrodes 15 (third example). Further, FIGS. 16A to 16I are graphs showing degrees of improvement obtained by analyzing the simulation results in a case where there are seven IDT electrodes 15 (fourth example). FIG. 15A to FIG. 15I and FIG. 16A to FIG. 16I correspond to the "BAND 1" to "BAND 9" as shown at the tops of the graphs.

In each graph, the abscissa shows the magnitude of electrode finger pitch of the wide pitch section 25 in the same way as FIGS. 11A to 11I. The ordinate shows the maximum value of the differences between the amount of attenuation in the case where the wide pitch section 25 is not provided and the amount of attenuation in the case where the wide pitch section 25 is provided (maximum values lmax of improvement) in the frequency bands where securing attenuation is desired. The plurality of plotted lines correspond to the case where the wide pitch section 25 is provided in the center IDT electrode 15, the case where they are provided in the IDT electrodes 15 at the two sides of that, and the case where they are provided in further two IDT electrodes 15 located besides the former electrodes. Note that, each wide pitch section 25 is provided at the center in the IDT electrode 15 in which the wide pitch section 25 is provided.

It is confirmed from these graphs that substantially an effect of improvement of the amount of attenuation is exhibited when the wide pitch section 25 is provided in any IDT electrode 15 and even when provided with various magnitudes of electrode finger pitches.

Fifth Example

Simulations were run for four patterns of conditions changed in settings of the wide pitch section 25 for the filter 209 having the same configuration as that of the second example which was shown in FIG. 7A and FIG. 7B. As a result, a variety of findings were obtained such as that a plurality of wide pitch sections may be provided. Specifically, these were as follows.

(Simulation Conditions Which Become Standard)

Figure 17:
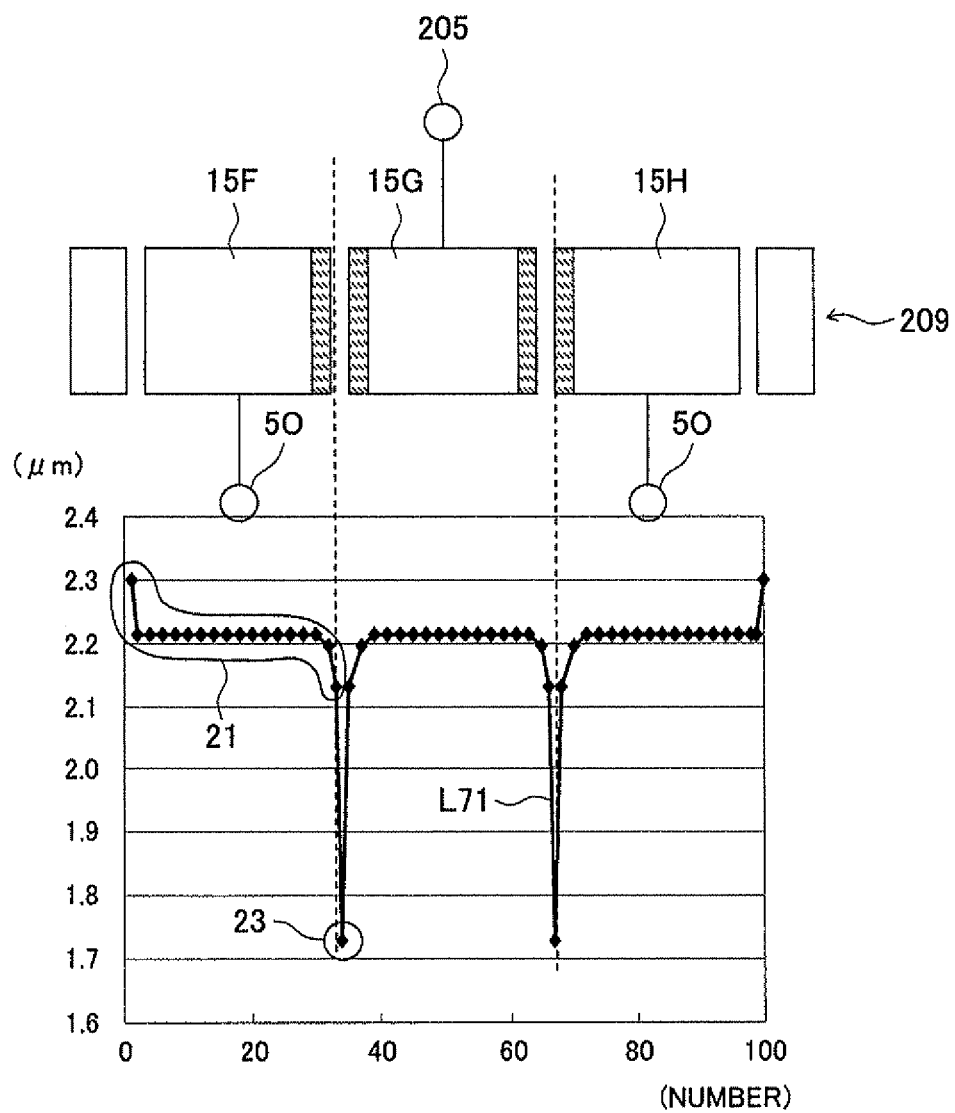
FIG. 17 A view showing the electrode finger pitch which becomes the standard in a fifth example of the present invention.

FIG. 17 is a diagram similar to FIG. 7B and FIG. 7C in the second example and showing the standard electrode finger pitch. As explained later, the electrode finger pitches of the four patterns in the fifth example are obtained by changing the wide pitch section 25 from the standard electrode finger pitch. Note that, below, the filter 209 having the standard electrode finger pitch is sometimes referred to as a comparative example.

In the same way as the second example, the filter 209 of the comparative example has three IDT electrodes 15, and each IDT electrode 15 has a main pitch section 21 and narrow pitch sections 23. Further, in the same way as the second example, the electrode finger pitch of the main pitch section 21 of the comparative example is made constant (more simplified than actual electrode finger pitch). However, the specific magnitudes etc. of electrode finger pitches in the narrow pitch section 23 etc. slightly differ from those in the second example. Further, in the comparative example, the wide pitch section 25 is not provided.

(Evaluation Method)

In the same way as the second example, the amounts of attenuation and insertion loss are analyzed for the normalized frequencies of a UMTS ("Nrml" in FIG. 8). Note, for the frequency band to be analyzed for attenuation, "Tx" of "BAND 5" in FIG. 8 (824 to 849 MHz) is selected. This is because, as shown in FIG. 11, the tendency of improvement of attenuation becomes typical in "BAND 5". Further, for the frequency band to be analyzed for insertion loss, "Rx" of "BAND 1" in FIG. 8 (869 to 894 MHz) is selected. The normalized "Rx" substantially overlap each other among a plurality of BANDS. Therefore, it is considered that any BAND may be selected.

For both of the amount of attenuation and insertion loss, the maximum values in the above frequency bands are extracted, and a comparison made between the comparative example and the four patterns in the example.

(First Pattern)

Figure 18:
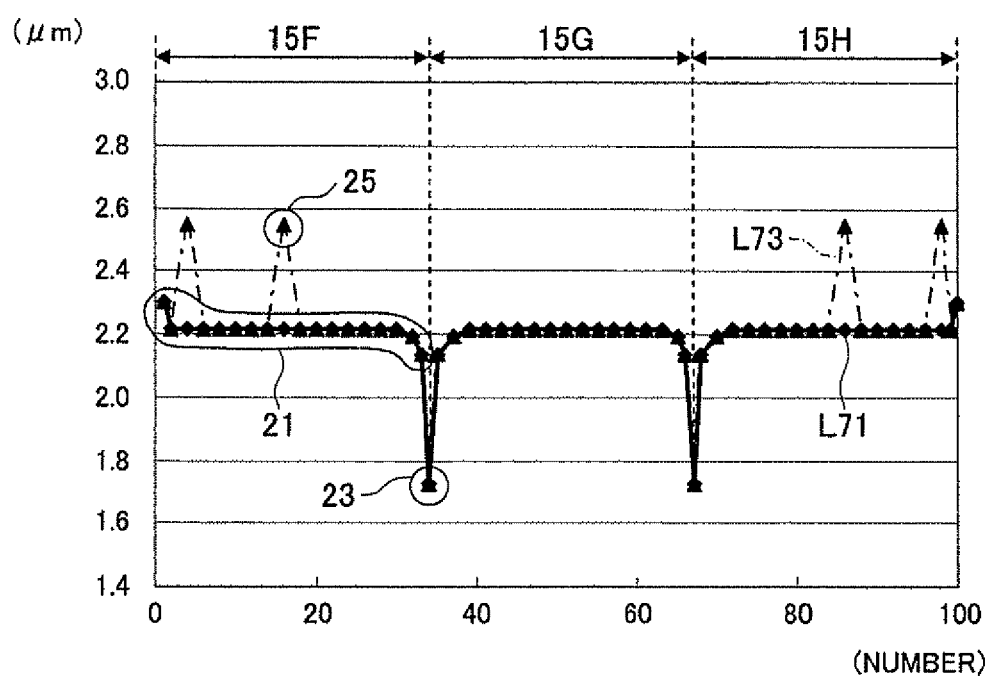
FIG. 18 A view showing the electrode finger pitch of a first pattern of the fifth example.

FIG. 18 is a graph similar to FIG. 17 and showing the electrode finger pitch of the first pattern of the fifth example. The solid line L71 indicates the electrode finger pitch of the comparative example shown in FIG. 17, and the chain line L73 indicates the electrode finger pitch of the first pattern.

The first pattern is the comparative example except where wide pitch sections 25 are provided in the IDT electrodes 15 at the two sides. In each of the IDT electrodes 15 at the two sides, two wide pitch sections 25 are provided. Specifically, the two wide pitch sections 25 are provided, in each IDT electrode 15, at the center and at the end portion which becomes the outer side of the three IDT electrodes 15. The magnitudes of the electrode finger pitches of the two wide pitch sections 25 are the same as each other and further set larger by 15% than the electrode finger pitch of the main pitch section 21 other than the wide pitch section 25. In each wide pitch section 25, the number of the electrode finger pitch is one. Note that, between the two wide pitch sections 25 provided in each IDT electrode 15, one is an embodiment of the first wide pitch section of the present invention, while the other is an embodiment of the second wide pitch section. Further, between the two wide pitch sections 25 provided in each IDT electrode 15, the two electrode fingers configuring one wide pitch section 25 are one embodiment of the first electrode finger and second electrode finger of the present invention, while the two electrode fingers configuring the other wide pitch section 25 are one embodiment of the third electrode finger and fourth electrode finger of the present invention.

Figure 19:
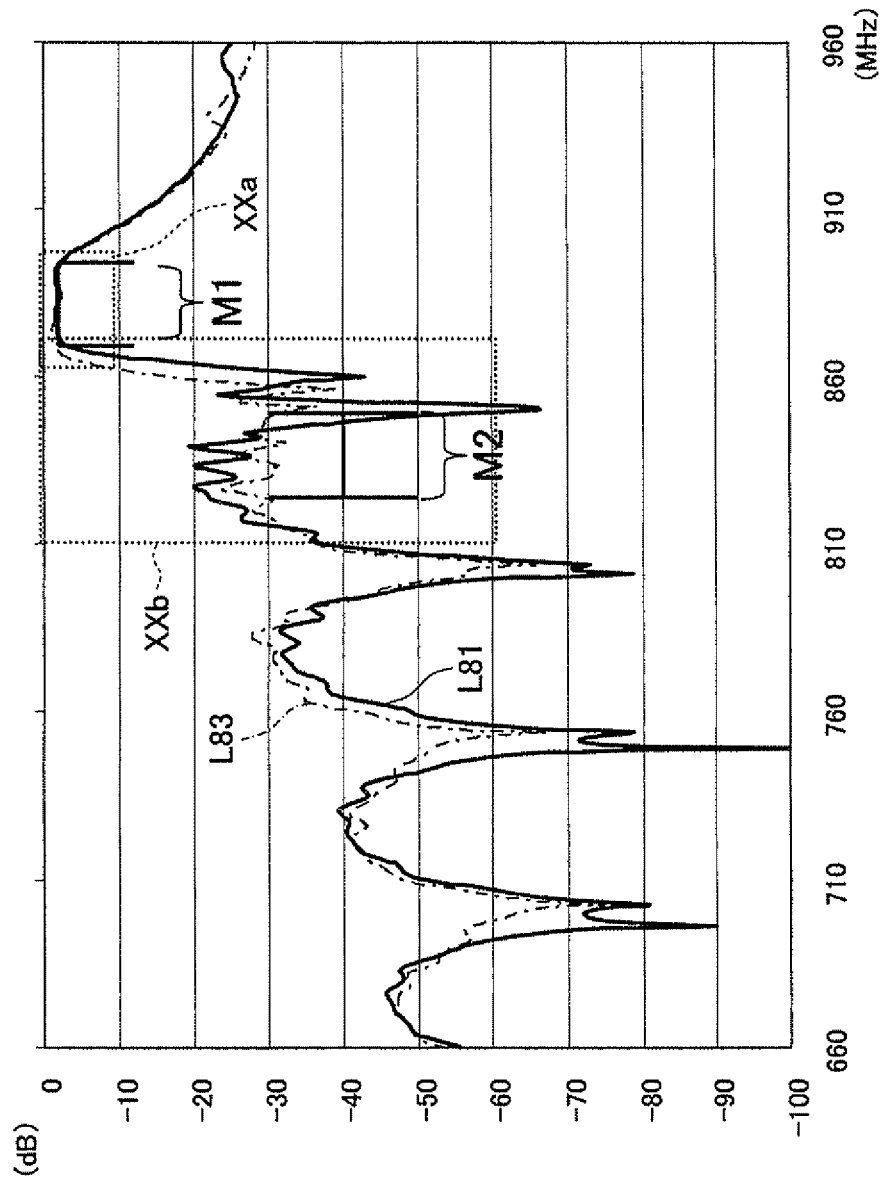
FIG. 19 A view showing the simulation results of the first pattern and a comparative example.
Figure 20A:
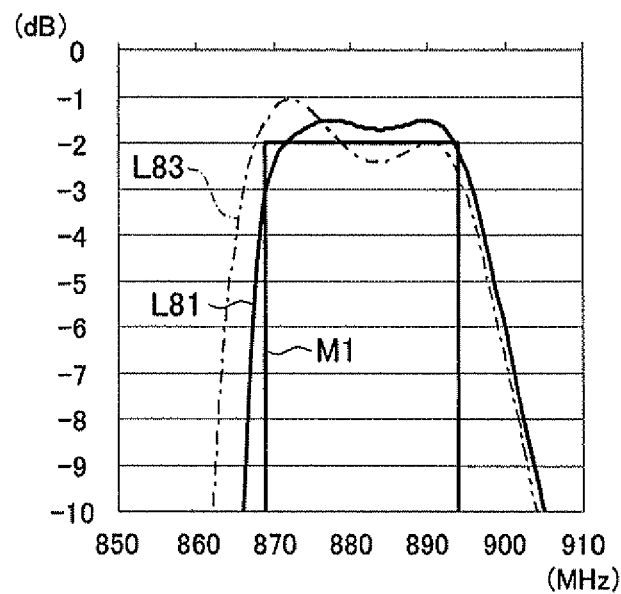
FIG. 20 is an enlarged view of a region XXa in FIG. 19.
FIG. 20B is an enlarged view of a region XXb in FIG. 19.
Figure 20B:
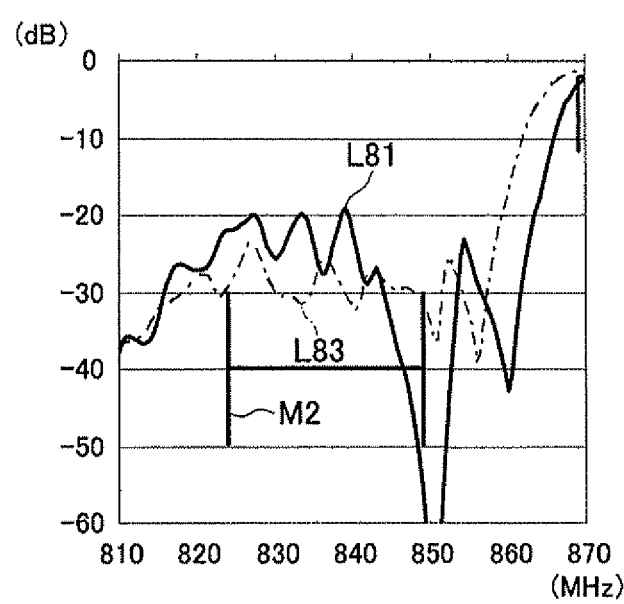

FIG. 19 is a graph similar to FIG. 9A and showing the simulation results of the first pattern and the comparative example. FIG. 20A is an enlarged view of a region XXa in FIG. 19, while FIG. 20B is an enlarged view of a region XXb in FIG. 19. In FIG. 19 and FIGS. 20A and 20B, the solid lines L81 indicate the simulation results of the comparative example, while the chain lines L83 indicate the simulation results of the first pattern. Further, the marks M1 indicate the frequency bands for analysis of insertion loss, while the marks M2 indicate the frequency bands for analysis of the amount of attenuation.

As shown in these diagrams, in the first pattern, compared with the comparative example, the attenuation characteristic is improved, but the insertion loss does not change so much. The maximum values of the amounts of attenuation (Imax) and the maximum values of insertion loss (Lmax) in the frequency bands for analysis become as follows.

[Comparative example] Imax: −19.12 dB, Lmax: 3.1 dB
[First pattern] Imax: −23.85 dB, Lmax: 2.8 dB
[Amounts of improvement] Imax: 4.46 dB, Lmax: 0.3 dB (Second Pattern)

Figure 21:
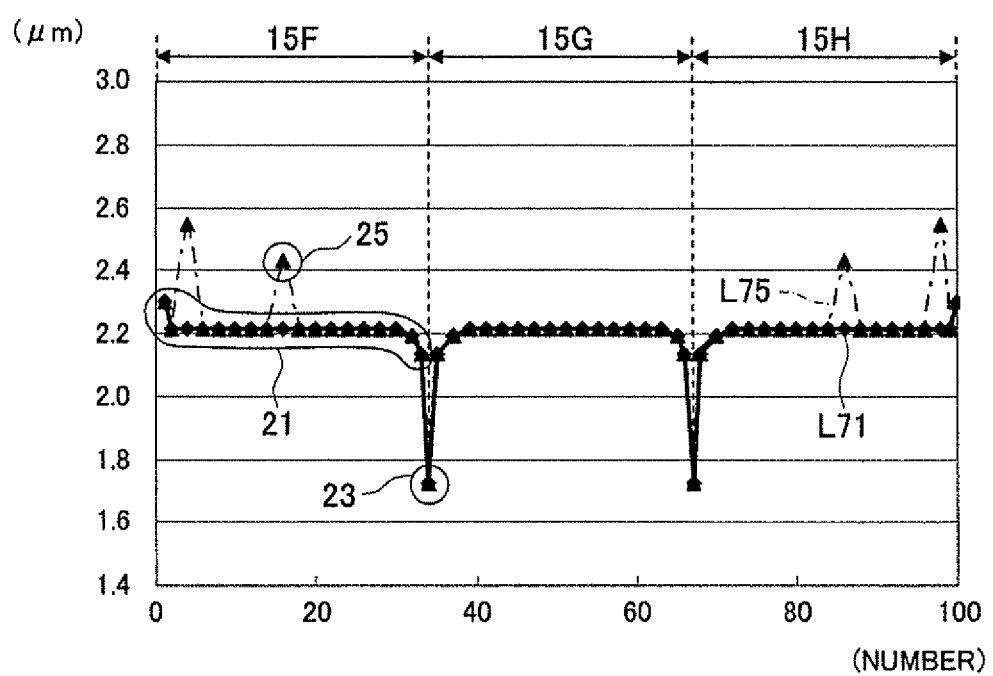
FIG. 21 A view showing the electrode finger pitch of a second pattern of the fifth example.

FIG. 21 is a graph similar to FIG. 17 and showing the electrode finger pitch of the second pattern of the fifth example. The solid line L71 indicates the electrode finger pitch of the comparative example shown in FIG. 17, while the chain line L75 indicates the electrode finger pitch of the second pattern.

As will be understood from a comparison with FIG. 18, the second pattern differs from the first pattern in only the magnitude of the electrode finger pitch of the wide pitch section 25 at the center of the IDT electrode 15. Specifically, the electrode finger pitch of the wide pitch section 25 at the outer side is set larger by 15% with respect to the other electrode finger pitches in the same way as the first pattern, but the electrode finger pitch of the wide pitch section 25 at the center is set larger by 10% with respect to the other electrode finger pitches. That is, in the second pattern, the IDT electrode 15 has two wide pitch sections 25 having different magnitudes.

Figure 22:
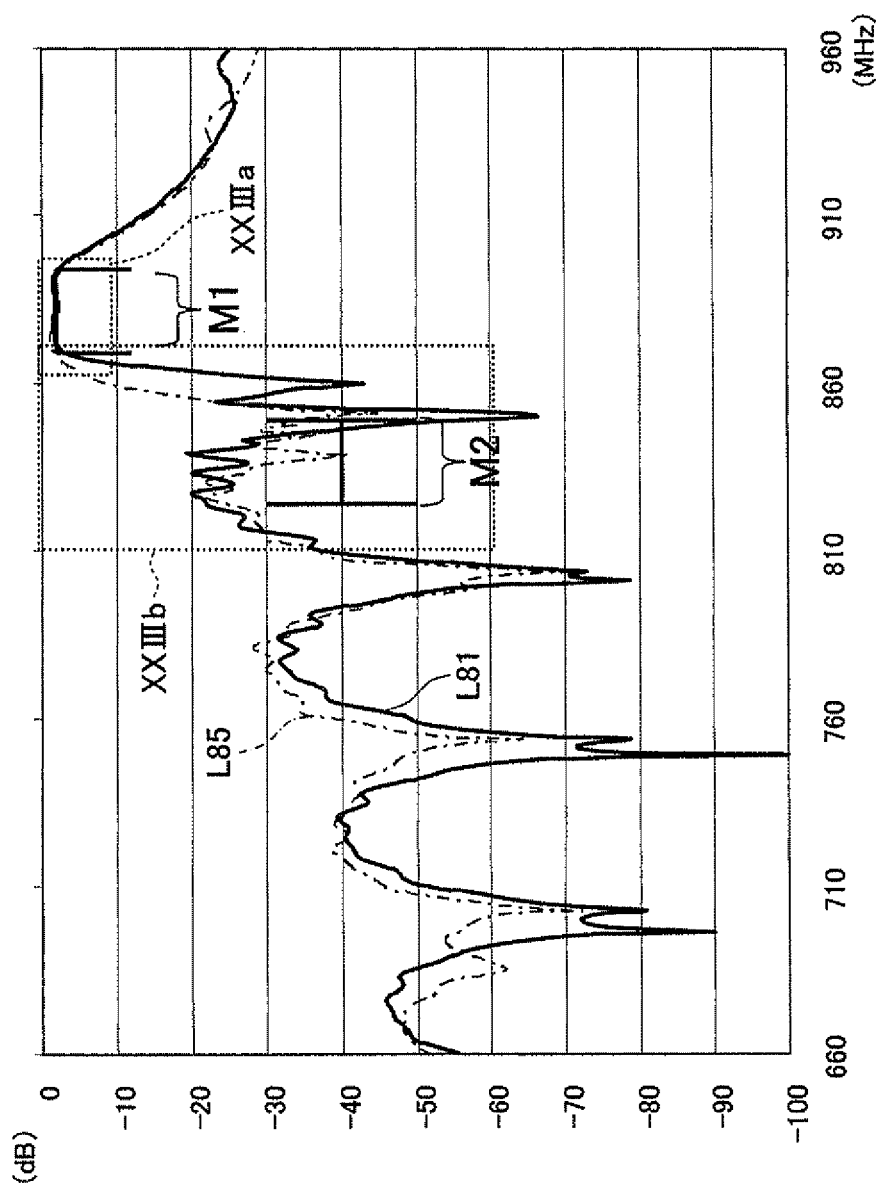
FIG. 22 A view showing the simulation results of the second pattern and a comparative example.
Figure 23A:
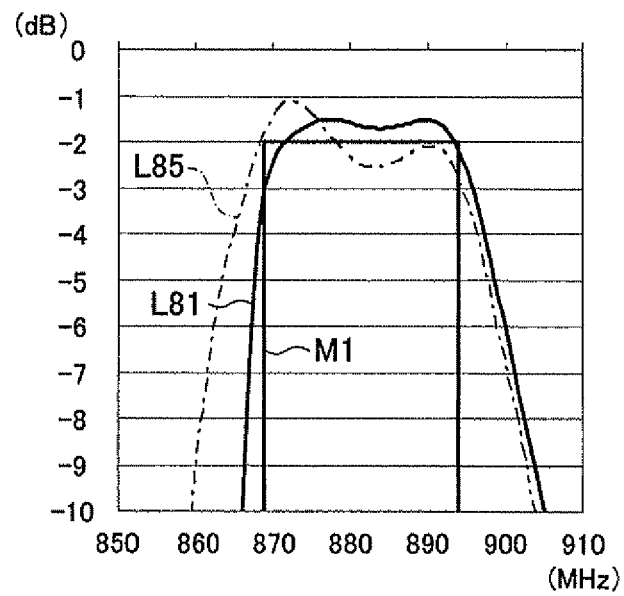
FIG. 23 is an enlarged view of a region XXIIIa in FIG. 22.
FIG. 23B is an enlarged view of a region XXIIIb in FIG. 22.
Figure 23B:
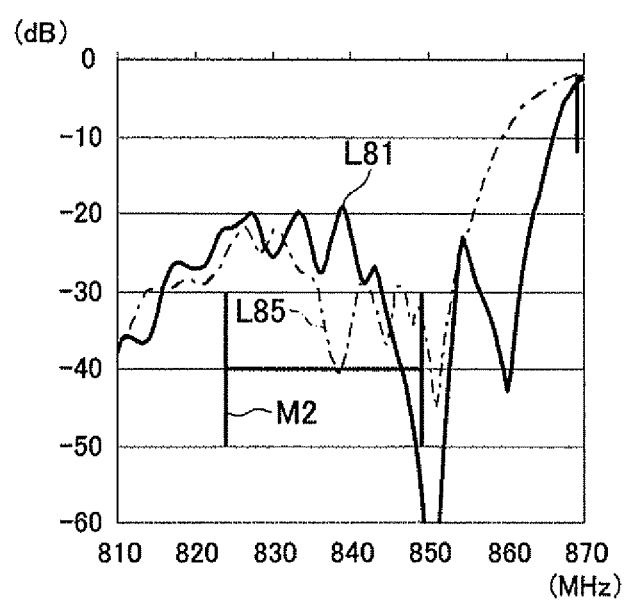

FIG. 22 is a graph similar to FIG. 19 and showing the simulation results of the second pattern and the comparative example. FIG. 23A is an enlarged view of a region XXIIIa in FIG. 22. FIG. 23B is an enlarged view of a region XXIIIb in FIG. 22. In FIG. 22 and FIGS. 23A and 23B, the solid lines L81 indicate the simulation results of the comparative example, while the chain lines L85 indicate the simulation results of the second pattern.

As shown in these diagrams, in the second pattern, compared with the comparative example, the attenuation characteristic is improved, but the insertion loss does not change so much. The maximum values of the amounts of attenuation (Imax) and the maximum values of insertion loss (Lmax) in the frequency bands for analysis become as follows.
[Comparative example] Imax: −19.12 dB, Lmax: 3.1 dB
[Second pattern] Imax: −21.78 dB, Lmax: 2.8 dB
[Amounts of improvement] Imax: 2.66 dB, Lmax: 0.3 dB (Third Pattern)

Figure 24:
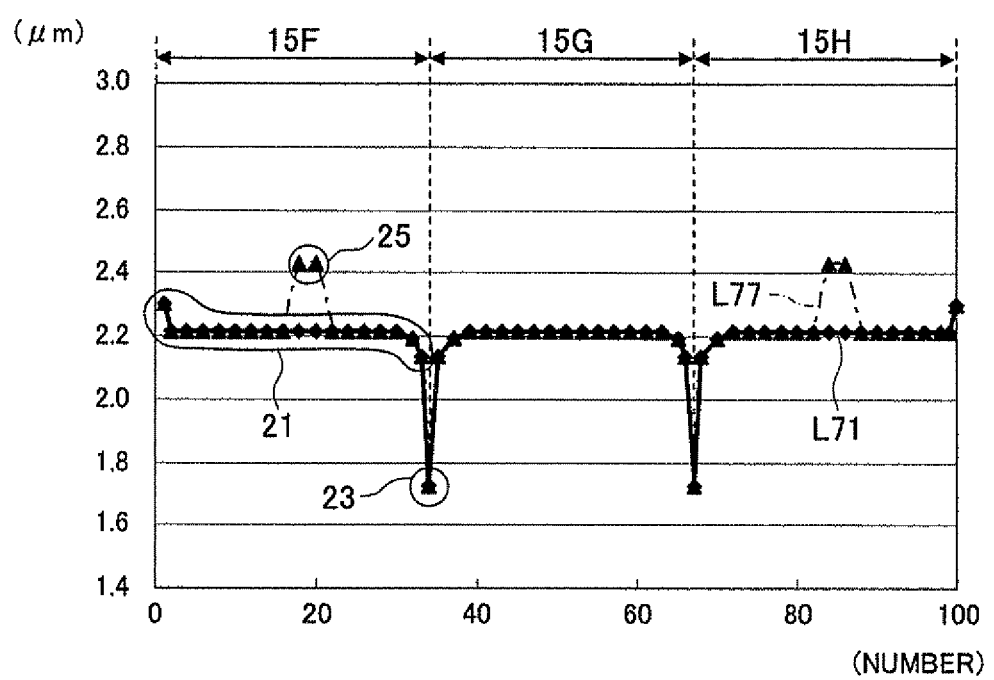
FIG. 24 A view showing the electrode finger pitch of a third pattern of the fifth example.

FIG. 24 is a graph similar to FIG. 17 and showing the electrode finger pitch of the third pattern of the fifth example. The solid line L71 indicates the electrode finger pitch of the comparative example shown in FIG. 17, while the chain line L77 indicates the electrode finger pitch of the third pattern.

The third pattern, like the first and second patterns, provides wide pitch sections 25 in the IDT electrodes 15 at the two sides. However, in each IDT electrode 15, one wide pitch section 25 is provided. Further, the number of the electrode finger pitches is two in each wide pitch section 25. In other words, each wide pitch section 25 is configured by three electrode fingers which continuously aligned. Among these three electrode fingers, the electrode finger located at the center is an embodiment of the fifth electrode finger of the present invention, while the other two are embodiments of the sixth electrode finger and seventh electrode finger of the present invention. Note that, each wide pitch section 25 is arranged at the center of each IDT electrode 15. Further, the magnitudes of the two electrode finger pitches of the wide pitch sections 25 are the same as each other and are set larger by a ratio of 10% relative to the other electrode finger pitches.

Figure 25:
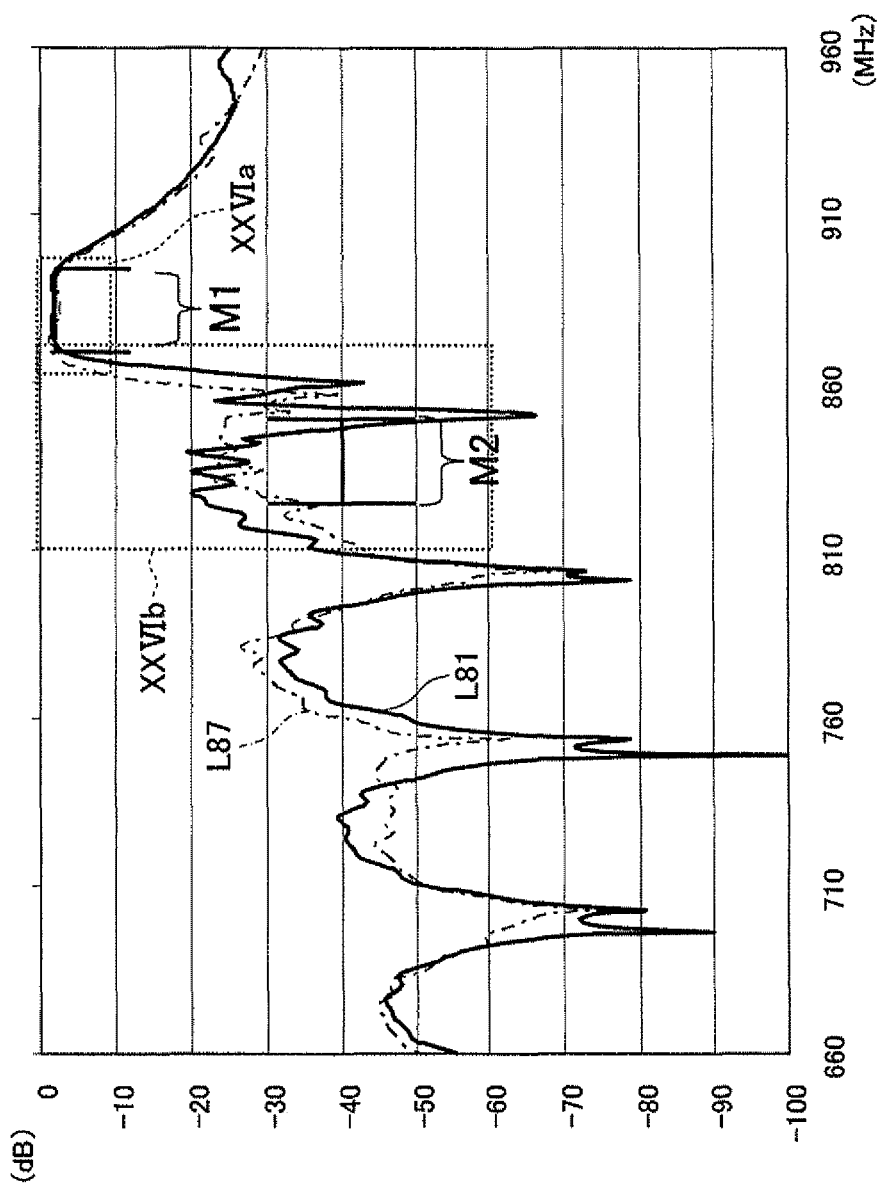
FIG. 25 A view showing the simulation results of the third pattern and the comparative example.
Figure 26A:
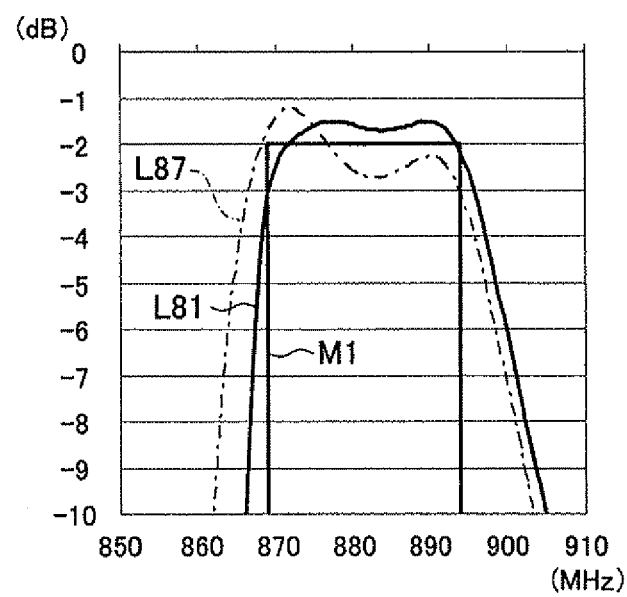
Figure 26B:
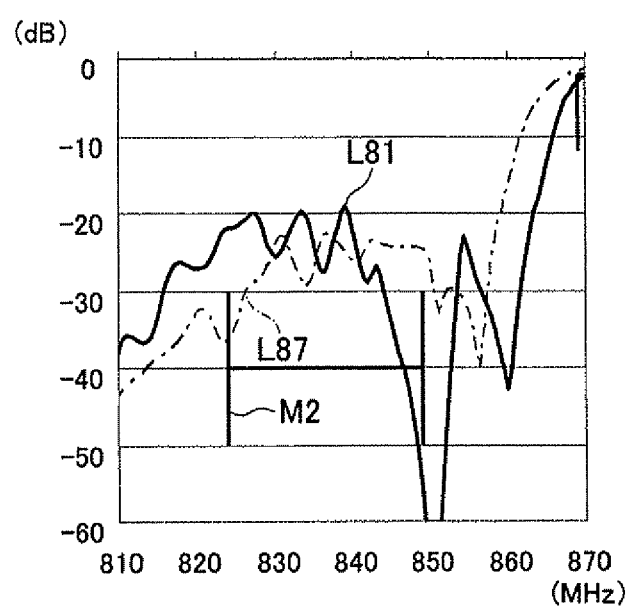
FIG. 26B is an enlarged view of a region XXVIb in FIG. 25.

FIG. 25 is a graph similar to FIG. 19 and showing the simulation results of the third pattern and the comparative example. FIG. 26A is an enlarged view of a region XXVIa in FIG. 25. FIG. 26B is an enlarged view of a region XXVIb in FIG. 25. In FIG. 25 and FIGS. 26A and 26B, the solid lines L81 indicate the simulation results of the comparative example, while the chain lines L87 indicate the simulation results of the third pattern.

As shown in these diagrams, in the third pattern, compared with the comparative example, the attenuation characteristic is improved, but the insertion loss does not change so much. The maximum values of the amounts of attenuation (Imax) and the maximum values of insertion loss (Lmax) in the frequency bands for analysis become as follows.
[Comparative example] Imax: −19.12 dB, Lmax: 3.1 dB
[Third pattern] Imax: −22.66 dB, Lmax: 3.1 dB
[Amounts of improvement] Imax: 3.54 dB, Lmax: 0.0 dB (Fourth Pattern)

Figure 27:
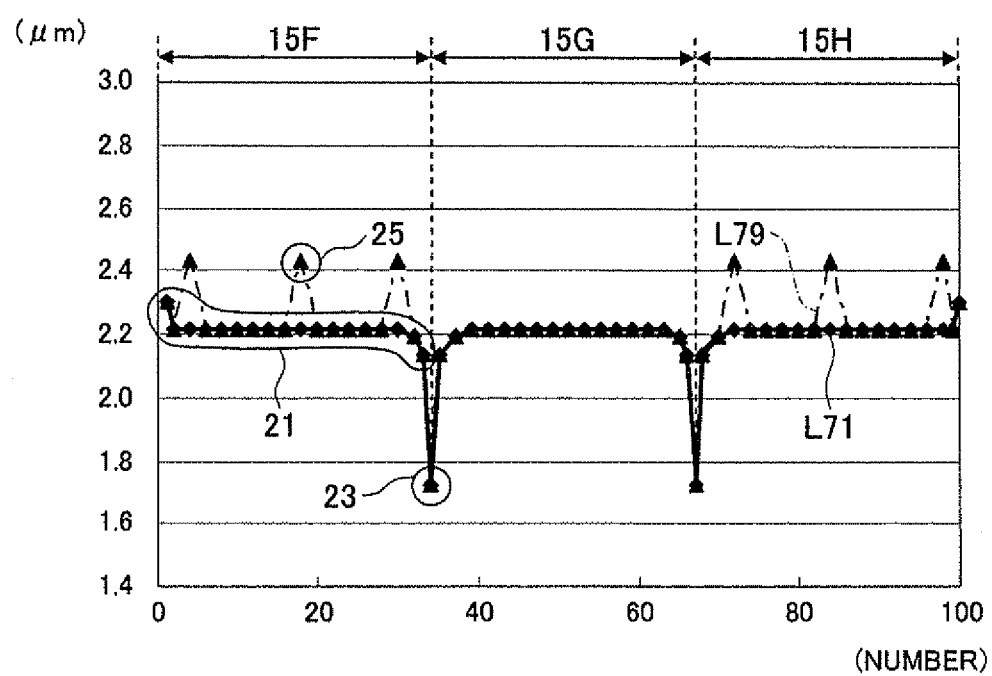
FIG. 27 A view showing the electrode finger pitch of a fourth pattern of the fifth example.

FIG. 27 is a graph similar to FIG. 17 and showing the electrode finger pitch of the fourth pattern of the fifth example. The solid line L71 indicates the electrode finger pitch of the comparative example shown in FIG. 17, while the chain line L79 indicates the electrode finger pitch of the fourth pattern.

The fourth pattern, like the first to third patterns, provides wide pitch sections 25 in the IDT electrodes 15 at the two sides. However, in each IDT electrode 15, three wide pitch sections 25 are provided. Further, the number of electrode finger pitches is two in each wide pitch section 25. Note that, the three wide pitch sections 25 are arranged at the center and two sides of each IDT electrode 15. Further, the magnitudes of the electrode finger pitches of the three wide pitch sections 25 are the same as each other and are set larger by a ratio of 10% relative to the other electrode finger pitches.

Figure 28:
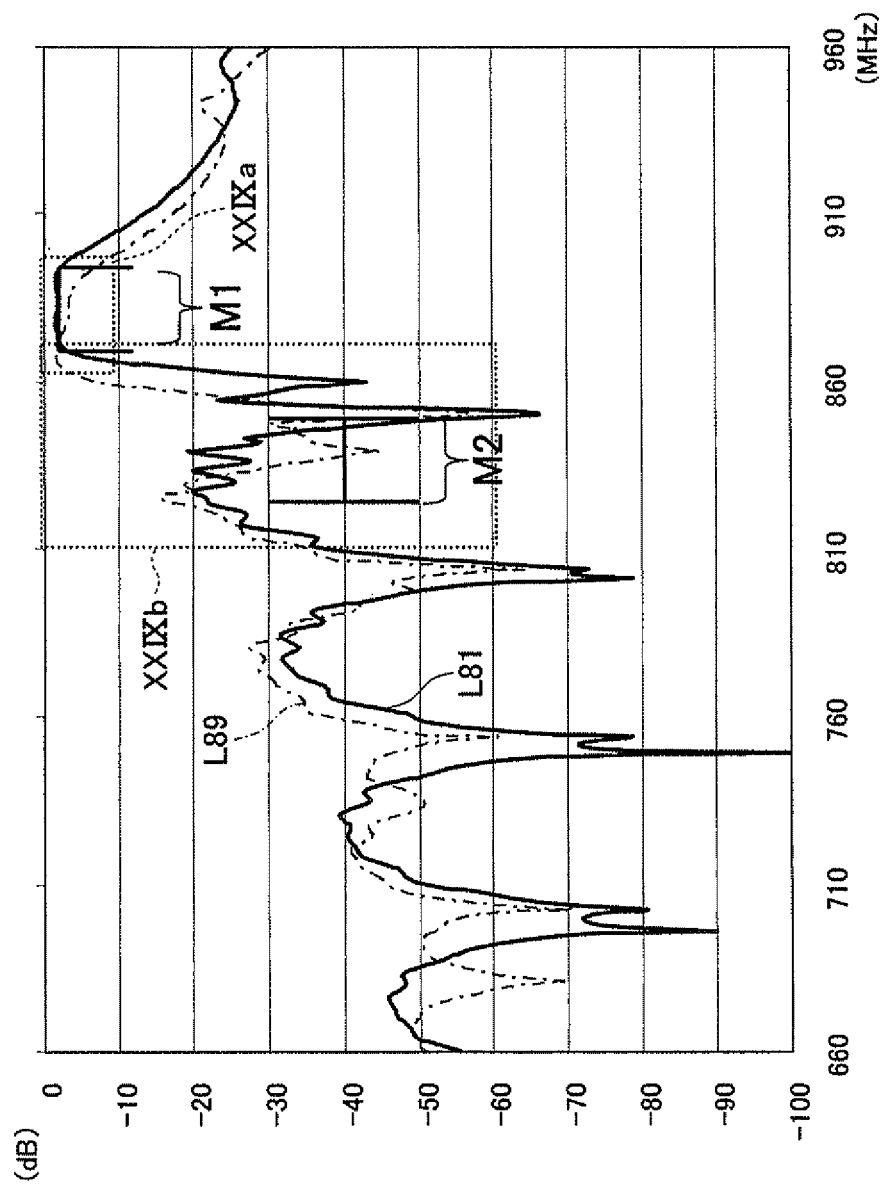
FIG. 28 A view showing the simulation results of the fourth pattern and a comparative example.
Figure 29A:
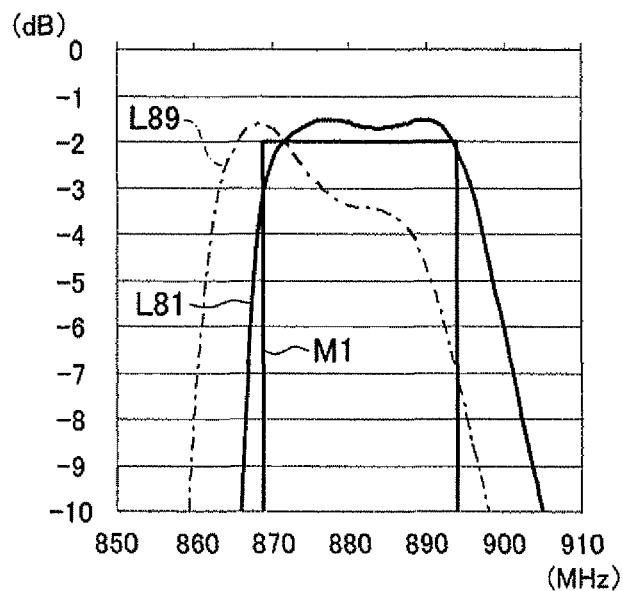
Figure 29B:
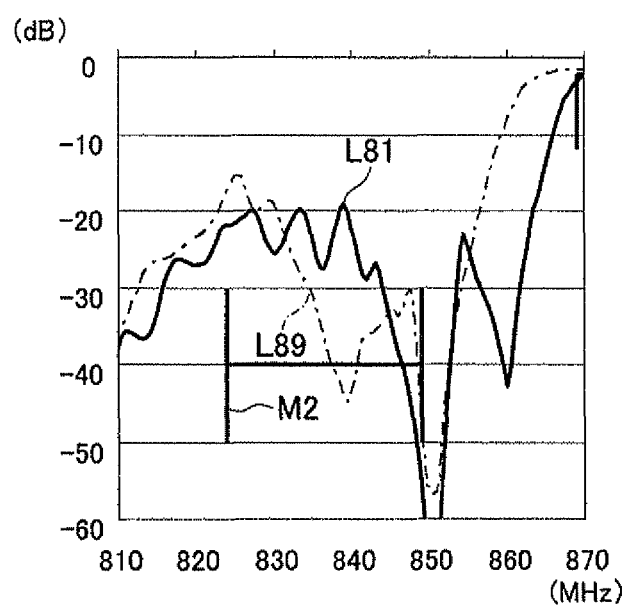
FIG. 29B is an enlarged view of a region XXIXb in FIG. 28.

FIG. 28 is a graph similar to FIG. 19 and showing the simulation results of the fourth pattern and the comparative example. FIG. 29A is an enlarged view of a region XXIXa in FIG. 28. FIG. 29B is an enlarged view of a region XXIXb in FIG. 25. In FIG. 28 and FIGS. 29A and 29B, the solid lines L81 indicate the simulation results of the comparative example, while the chain lines L89 indicate the simulation results of the fourth pattern.

As shown in these diagrams, in the fourth pattern, compared with the comparative example, the amount of attenuation is larger in the frequency bands indicated by the marks M2 as a whole, but there is a frequency band (820 to 830 MHz) in which the amount of attenuation is small. Further, the insertion loss is degraded. The maximum values of the amounts of attenuation (Imax) and the maximum values of insertion loss (Lmax) in the frequency bands for analysis become as follows.
[Comparative example] Imax: −19.12 dB, Lmax: 3.1 dB
[Fourth pattern] Imax: −15.52 dB, Lmax: 7.2 dB
[Amounts of improvement] Imax: −3.60 dB, Lmax: −4.1 dB As described above, even in the case where there are two electrode finger pitches of the wide pitch sections 25 in one IDT electrode 15 (first to third patterns), an improvement of the attenuation characteristics was seen. That is, it was confirmed that two electrode finger pitches of the wide pitch sections 25 may be provided in an IDT electrode 15.

Further, it was confirmed that the two electrode finger pitches of the wide pitch sections 25 may be same size as each other (first and third patterns) or may be different from each other (second pattern).

Further, it was confirmed that the two spaces between electrode fingers of the wide pitch sections 25 may be separated from each other (first and second patterns) or may be adjacent to each other (third pattern). In other words, it was confirmed that two wide pitch sections 25 each having one electrode finger pitch may be provided or one wide pitch section 25 having two electrode finger pitches may be provided.

Even when three electrode finger pitches are provided in a wide pitch section 25, an effect of increase of the amount of attenuation is expected (fourth pattern). However, when considering reduction of insertion loss, one or two electrode finger pitches of the wide pitch sections 25 is preferred.

The present invention is not limited to the above embodiment and may be worked in various ways.

The surface acoustic wave device may also be one having several cascade connected acoustic wave filters. The input signal or output signal of the surface acoustic wave filter may be either a balanced signal or an unbalanced signal. The number of the IDT electrodes is not limited to an odd number, but may be an even number as well.

The number of the electrode finger pitches in a wide pitch section is not limited to one or two. It is sufficient that the number of electrode finger pitches be smaller than those of a first pitch section and a second pitch section which are adjacent to the two sides of the wide pitch section and have constant electrode finger pitches. In other words, it is sufficient that the number of the electrode fingers configuring the wide pitch section be smaller than the numbers of electrode fingers configuring the first pitch section and the second pitch section. In this case, the wide pitch section is clearly differentiated from the design viewpoint from the first pitch section and second pitch section which are dominant in the filter characteristic. For example, the number of electrode finger pitches in the wide pitch section may be three as well. Further, in the case where two or more electrode finger pitches are provided in the wide pitch section, the magnitudes of these electrode finger pitches are not limited to mutually the same extents and may be different from each other.

The number of the wide pitch sections provided in one IDT electrode is not limited to one to three and may be four or more as well. Note, as shown in the fifth example, the larger the number of electrode finger pitches of the wide pitch sections, the larger the insertion loss. Accordingly, preferably the number of the wide pitch sections and the number of the electrode finger pitches in each wide pitch section are set so that a sum of the electrode finger pitches of the wide pitch sections in one IDT electrode becomes two or less.

The positions of the wide pitch sections and magnitudes of the electrode finger pitches may be suitably set. The concrete values may be suitably designed in accordance with the frequencies of the passbands, frequencies for which attenuation is expected, expected amount of attenuation, number of IDTs, characteristics of the resonator, and so on.

REFERENCE SIGNS LIST

1 . . . surface acoustic wave device, 3 . . . substrate, 9 . . . surface acoustic wave filter, 15 . . . IDT electrode, 19f . . . electrode finger, 25 . . . wide pitch section, 29A . . . first pitch section, and 29B . . . second pitch section.

The invention claimed is:

1. A surface acoustic wave device, comprising:
a piezoelectric substrate and
a surface acoustic wave filter comprising a plurality of interdigital transducer (IDT) electrodes which are provided on the piezoelectric substrate and are arranged along a propagation direction of a surface acoustic wave, wherein
each of the plurality of IDT electrodes comprises a group of electrode fingers which extend in a direction orthogonal to the propagation direction and which are arranged along the propagation direction spaced apart from each other at predetermined intervals,
at least one of the plurality of IDT electrodes comprises
a first adjacent pitch section in which a plurality of intervals of the electrode fingers group are constant,
a second adjacent pitch section in which a plurality of intervals of the electrode fingers group are constant and the same as the plurality of intervals of the first adjacent pitch section, and
a wide pitch section which is between the first adjacent pitch section and the second adjacent pitch section and adjacent to the first adjacent pitch section and the second adjacent pitch section, and has only two intervals of electrode fingers,
the intervals of the wide pitch section are larger than the intervals of the first adjacent pitch section and the second adjacent pitch section and are larger than the average value of remaining intervals of the electrode fingers group other than the intervals of the wide pitch section in the first IDT electrode.

2. A surface acoustic wave device, comprising:
a piezoelectric substrate and
a surface acoustic wave filter comprising a plurality of interdigital transducer (IDT) electrodes which are provided on the piezoelectric substrate and are arranged along a propagation direction of a surface acoustic wave, wherein
each of the plurality of IDT electrodes comprises a group of electrode fingers which extend in a direction orthogonal to the propagation direction and which are arranged along the propagation direction spaced apart from each other at predetermined intervals,
a first IDT electrode included in the plurality of IDT electrodes comprises
a first adjacent pitch section in which a plurality of intervals of the electrode fingers group are constant,
a second adjacent pitch section in which a plurality of intervals of the electrode fingers group are constant and the same as the plurality of intervals of the first adjacent pitch section, and
a first wide pitch section which is between the first adjacent pitch section and the second adjacent pitch section and adjacent to the first adjacent pitch section and the second adjacent pitch section, and has only one interval of electrode fingers,
the interval of the first wide pitch section is larger than intervals of the first adjacent pitch section and the second adjacent pitch section and is larger than an average value of remaining intervals of the electrode fingers group other than the intervals of the first wide pitch section in the first IDT electrode.

3. The surface acoustic wave device according to claim 2, wherein the first IDT electrode comprises the first wide pitch section at the center thereof.

4. The surface acoustic wave device according to claim 2, wherein the first IDT electrode is an IDT electrode which is located on one end among the plurality of IDT electrodes.

5. The surface acoustic wave device according to claim 2, wherein the interval of the first wide pitch section is larger by 4% to 30% than the average value of remaining intervals among the electrode fingers group other than the interval of the first wide pitch section in the first IDT electrode.

6. The surface acoustic wave device according to claim 2, wherein: the first IDT electrode further comprises a second wide pitch section including an interval of the electrode fingers which is larger than the average value of remaining intervals of the electrode fingers in the first IDT electrode other than the intervals of the first wide pitch section and the second wide pitch section.

7. The surface acoustic wave device according to claim 2 or 1, wherein: the plurality of IDT electrodes comprises a three or more odd number of IDT electrodes, and the surface acoustic wave filter is a cascade-connected double-mode type surface acoustic wave filter.

8. A surface acoustic wave device, comprising:
a piezoelectric substrate and
a surface acoustic wave filter comprising three or more interdigital transducer (IDT) electrodes which are provided on the piezoelectric substrate and are arranged along a propagation direction of a surface acoustic wave, wherein
each of the three or more IDT electrodes comprises a group of electrode fingers which extend in a direction orthogonal to the propagation direction and which are arranged along the propagation direction spaced apart from each other at predetermined intervals,
one of two IDT electrodes included in the three or more IDT electrodes and located at both ends among the three or more IDT electrodes comprises a wide pitch section which has one or more intervals of the electrode fingers group located inside other than two intervals of the both ends of the one of the two IDT electrodes, being larger than any intervals of any IDT electrodes other than the two IDT electrodes located at both ends and being the largest among all intervals of the three or more IDT electrodes.

9. The surface acoustic wave device according to claim 8, wherein the three or more IDT electrodes are odd number of IDT electrodes, and the surface acoustic wave filter is a cascade-connected double-mode type surface acoustic wave filter.

10. The surface acoustic wave device according to claim 8, wherein the other one of the two electrodes located on both ends comprises the wide pitch section, too.

11. The surface acoustic wave device according to claim 8, wherein in the one of the two IDT electrodes, one of the two intervals which is located on an end adjacent to an interval between the one of the two IDT electrodes and a IDT electrode adjacent to the one of the two IDT electrodes is the smallest among intervals of the one of the two IDT electrodes.

12. The surface acoustic wave device according to claim 8, wherein the wide pitch section is located at the center of the one of the two IDT electrodes.

13. The surface acoustic wave device according to claim 8, wherein the one or more intervals of the wide pitch section is larger by 4% to 30% than the average value of remaining intervals of the electrode fingers group other than the one or more intervals of the wide pitch section in the one of the two IDT electrodes.

14. The surface acoustic wave device according to claim 8, wherein in the one of the two IDT electrodes, an each of first intervals located at a side of an IDT electrode adjacent to the one of the two IDT electrodes with respect to the wide pitch section is different from each of second intervals located at the side opposite to the side of the IDT electrode adjacent to the one of the two IDT electrodes with respect to the wide pitch section, the first intervals including one of the two intervals and the second intervals including another of the two intervals.

15. The surface acoustic wave device according to claim 8, wherein in the one of the two IDT electrodes, each of first intervals located at a side of an IDT electrode adjacent to the one of the two IDT electrodes with respect to the wide pitch section is smaller than each of second intervals located at the side opposite to the side of the IDT electrode adjacent to the one of the two IDT electrodes with respect to the wide pitch section, the first intervals including one of the two intervals and the second intervals including another one of the two intervals.

* * * * *